US010951973B2

(12) United States Patent
He et al.

(10) Patent No.: US 10,951,973 B2
(45) Date of Patent: Mar. 16, 2021

(54) HEADSET, TERMINAL, AND CONTROL METHOD

(71) Applicant: Huawei Technologies Co., Ltd., Shenzhen (CN)

(72) Inventors: Guang He, Wuhan (CN); Xiaojin Zhu, Wuhan (CN); Zhengjin Zhang, Wuhan (CN); Silong Chen, Wuhan (CN); Peitao Xi, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/492,352

(22) PCT Filed: Jul. 28, 2017

(86) PCT No.: PCT/CN2017/094980
§ 371 (c)(1),
(2) Date: Sep. 9, 2019

(87) PCT Pub. No.: WO2018/161496
PCT Pub. Date: Sep. 13, 2018

(65) Prior Publication Data
US 2020/0236454 A1    Jul. 23, 2020

(30) Foreign Application Priority Data
Mar. 9, 2017  (CN) .......................... 201710138322.6

(51) Int. Cl.
*H04R 1/10* (2006.01)
*H03K 5/24* (2006.01)
(Continued)

(52) U.S. Cl.
CPC .............. *H04R 1/1041* (2013.01); *H03K 5/24* (2013.01); *H03M 1/12* (2013.01); *H04M 1/6058* (2013.01);
(Continued)

(58) Field of Classification Search
CPC .............. H04R 1/1041; H04R 2420/03; H04R 2420/05; H04R 2460/03; H04M 1/72569; H03M 1/12; H03K 5/24
See application file for complete search history.

(56) References Cited

U.S. PATENT DOCUMENTS

2005/0079885 A1* 4/2005 Patino ................. H04M 1/6066
455/518
2008/0164994 A1* 7/2008 Johnson ................ H01R 29/00
340/533
(Continued)

FOREIGN PATENT DOCUMENTS

CN    101951534 A    1/2011
CN    101232742 B    10/2011
(Continued)

OTHER PUBLICATIONS

Machine Translation and Abstract of Chinese Publication No. CN101232742, Oct. 12, 2011, 10 pages.
(Continued)

*Primary Examiner* — David L Ton
(74) *Attorney, Agent, or Firm* — Conley Rose, P.C.

(57) ABSTRACT

A headset includes a connector configured to couple to a terminal, where the connector of the headset includes at least one functional pin. The headset further includes a sensor circuit and a logic control circuit. The sensor circuit is coupled to a functional pin of the connector of the headset using the logic control circuit. The sensor circuit is configured to sense a wearing status of the headset, and output a trigger signal to the logic control circuit when the wearing status changes. A sensor is added to the headset, and sensor information is fed back to the terminal.

20 Claims, 11 Drawing Sheets

(51) Int. Cl.
 *H03M 1/12* (2006.01)
 *H04M 1/60* (2006.01)
 *H04M 1/725* (2006.01)

(52) U.S. Cl.
 CPC ..... *H04M 1/72569* (2013.01); *H04R 2420/03* (2013.01); *H04R 2420/05* (2013.01); *H04R 2460/03* (2013.01)

(56) References Cited

U.S. PATENT DOCUMENTS

| | | | | |
|---|---|---|---|---|
| 2009/0179768 | A1* | 7/2009 | Sander | H04R 1/1041 340/13.27 |
| 2010/0029344 | A1* | 2/2010 | Enjalbert | H04R 3/00 455/569.1 |
| 2010/0172522 | A1 | 7/2010 | Mooring et al. | |
| 2012/0294454 | A1* | 11/2012 | Sakamoto | H04R 1/1041 381/66 |
| 2013/0005303 | A1* | 1/2013 | Song | H04M 1/21 455/411 |
| 2013/0223641 | A1* | 8/2013 | Lin | H04M 1/72527 381/77 |
| 2014/0093088 | A1 | 4/2014 | Tachibana et al. | |
| 2014/0242964 | A1* | 8/2014 | Seo | H04W 52/028 455/418 |
| 2015/0201267 | A1 | 7/2015 | Chang et al. | |
| 2015/0304757 | A1* | 10/2015 | Kim | H02J 7/00 381/74 |
| 2015/0312666 | A1* | 10/2015 | Park | H04R 1/1041 381/74 |
| 2016/0249127 | A1* | 8/2016 | Kim | G10K 11/178 |
| 2016/0365082 | A1* | 12/2016 | Poulsen | H04J 4/00 |
| 2017/0019725 | A1* | 1/2017 | Zhao | H03M 1/12 |
| 2017/0041711 | A1 | 2/2017 | Inakoshi | |

FOREIGN PATENT DOCUMENTS

| | | |
|---|---|---|
| CN | 103257873 A | 8/2013 |
| CN | 204014027 U | 12/2014 |
| CN | 105246002 A | 1/2016 |
| CN | 105759944 A | 7/2016 |
| CN | 105848037 A | 8/2016 |
| EP | 2720476 A1 | 4/2014 |
| EP | 2990943 A1 | 3/2016 |

OTHER PUBLICATIONS

Machine Translation and Abstract of Chinese Publication No. CN101951534, Jan. 19, 2011, 6 pages.
Machine Translation and Abstract of Chinese Publication No. CN105246002, Jan. 13, 2016, 15 pages.
Machine Translation and Abstract of Chinese Publication No. CN10575994, Jul. 13, 2016, 9 pages.
Machine Translation and Abstract of Chinese Publication No. CN105848037, Aug. 10, 2016, 15 pages.
Machine Translation and Abstract of Chinese Publication No. CN204014027, Dec. 10, 2014, 17 pages.
Foreign Communication From a Counterpart Application, European Application No. 17900145.8, Extended European Search Report dated Nov. 26, 2019, 6 pages.
Foreign Communication From a Counterpart Application, Chinese Application No. 201780034998.9, Chinese Office Action dated Dec. 3, 2019, 8 pages.
Foreign Communication From a Counterpart Application, PCT Application No. PCT/CN2017/094980, English Translation of International Search report dated Dec. 1, 2017, 2 pages.
Foreign Communication From a Counterpart Application, PCT Application No. PCT/CN2017/094980, English Translation of Written Opinion dated Dec. 1, 2017, 4 pages.

* cited by examiner

HEADSET, TERMINAL, AND CONTROL METHOD

CROSS-REFERENCE TO RELATED APPLICATIONS

This application is a U.S. National Stage of International Patent Application No. PCT/CN2017/094980 filed on Jul. 28, 2017, which claims priority to Chinese Patent Application No. 201710138322.6 filed on Mar. 9, 2017. Both of the aforementioned applications are hereby incorporated by reference in their entireties.

TECHNICAL FIELD

This application relates to the field of audio apparatus technologies, and in particular, to a headset, a terminal, and a control method.

BACKGROUND

With development of science and technology, functions of mobile communications terminals are increasingly powerful, so that a communication requirement of a user such as making a call can be met, and various entertainment functions such as listening to music or watching a video can also be implemented. During use, a user usually uses a headset to answer a call, listen to music, watch a video, or the like, to free hands. When the user is using the headset, if there is external interference, for example, when another person expects to communicate with the user, the user can communicate only after taking off the headset. However, after the user takes off the headset, a call that is being answered, music that is running, a video that is running, or the like still keeps running if the user does not manually enter a "pause" or "terminate" operation. Consequently, unnecessary power consumption is caused, and in addition, when manually entering the operation, the user often misses a piece of content, and consequently a received message is incomplete. When wearing the headset again, the user also needs to manually enter a play operation or the like. It is inconvenient for the user to use.

SUMMARY

Embodiments of this application provide a headset, a terminal, and a control method, so that it can be detected that a user wears or takes off a headset, and a terminal is controlled to perform a corresponding operation.

According to a first aspect, an embodiment of this application provides a headset, including a connector of the headset configured to connect to a terminal, where the connector of the headset includes at least one functional pin, the headset further includes a sensor circuit and a logic control circuit, and the sensor circuit is connected to a functional pin of the connector of the headset by using the logic control circuit; the sensor circuit is configured to: sense a wearing status of the headset, and output a trigger signal to the logic control circuit when the wearing status changes; and the logic control circuit is configured to change, based on the trigger signal, a voltage value on the functional pin connected to the logic control circuit, to trigger the terminal to perform a target operation event based on a changed voltage value on the functional pin, where the target operation event is preset for the voltage value on the functional pin.

In this embodiment of this application, the voltage on the functional pin can be changed after output of the sensor circuit passes through the logic control circuit, so that the terminal performs different operation events based on different voltage values on the functional pin.

With reference to the first aspect, in a first possible implementation of the first aspect, the sensor circuit includes a first sensor and a second sensor, the logic control circuit includes a logic controller, a transistor, and a first resistor, the logic controller includes a first input end, a second input end, and a logic output end, the first input end is connected to the first sensor, the second input end is connected to the second sensor, the logic output end is connected to one end of the first resistor by using the transistor, and the other end of the first resistor is connected to the functional pin.

In this embodiment of this application, after output of the two sensors is processed by the logic controller, a control signal can be output, and the transistor is controlled to be conducted or cut off, to change the voltage on the functional pin.

With reference to the first possible implementation of the first aspect, in a second possible implementation of the first aspect, the headset further includes a button circuit, the button circuit includes a plurality of buttons and a plurality of first button resistors that are in a one-to-one correspondence with the plurality of buttons, and each button is connected to the functional pin by using a first button resistor corresponding to the button.

In this embodiment of this application, each of different buttons may correspond to one first resistor, and each first resistor has a different resistance value. When the button is pressed, the voltage value on the functional pin is determined by a resistance value of the first resistor.

With reference to the second possible implementation of the first aspect, in a third possible implementation of the first aspect, the headset further includes a charging circuit, the charging circuit includes a battery and a charger, one end of the battery is connected to the charger, an input end of the charger is connected to the functional pin, and an output end of the charger is connected to the first sensor and the second sensor.

In this embodiment of this application, the charging circuit is configured to supply power to the sensor circuit, so that the sensor can detect the wearing status of the headset, and the terminal can perform different operation events based on different wearing statuses.

With reference to the first aspect, in a fourth possible implementation of the first aspect, the connector of the headset specifically includes a first functional pin and a second functional pin; the headset further includes a voltage regulator, a comparator, and a first switching switch, the first switching switch includes a first connection end, a second connection end, a first control end, and a first fixed end, the first control end is connected to the comparator, and the voltage regulator includes a voltage regulation input end and a voltage regulation output end; the comparator includes a first voltage input end, a second voltage input end, and a comparison output end, the first voltage input end is connected to the first functional pin and is configured to input a voltage value on the first functional pin, and the second voltage input end is connected to the voltage regulation output end of the voltage regulator and is configured to input a reference voltage value; and the comparison output end is connected to the first control end of the first switching switch, outputs a comparison result, determines, based on the comparison result, whether the first functional pin is connected to a power supply circuit or a MIC circuit, and when determining that the first functional pin is connected to the power supply circuit, controls the first fixed end of the first switching switch to connect to the first connection end, or when determining that the first functional pin is connected to the MIC circuit, controls the first fixed end of the first switching switch to connect to the second connection end, where the MIC circuit and the power supply circuit are provided by the terminal.

With reference to the fourth possible implementation of the first aspect, in a fifth possible implementation of the first aspect, the first fixed end of the first switching switch is connected to the logic control circuit, the first connection end is connected to the first functional pin, and the second connection end is connected to the second functional pin.

In this embodiment of this application, a sensor signal transmission channel can be switched based on different working statuses of the terminal.

With reference to the fifth possible implementation of the first aspect, in a sixth possible implementation of the first aspect, the headset further includes a button circuit, the button circuit includes a plurality of buttons and a plurality of first button resistors that are in a one-to-one correspondence with the plurality of buttons, and each button is connected to the first fixed end of the first switching switch by using a first button resistor corresponding to the button.

In this embodiment of this application, each of different buttons may correspond to one first resistor, and each first resistor has a different resistance value. When the button is pressed, the voltage value on the functional pin is determined by a resistance value of the first resistor.

With reference to the sixth possible implementation of the first aspect, in a seventh possible implementation of the first aspect, the sensor circuit includes a first sensor and a second sensor, the logic control circuit includes a logic controller, a transistor, and a first resistor, the logic controller includes a first input end, a second input end, and a logic output end, the first input end is connected to the first sensor, the second input end is connected to the second sensor, the logic output end is connected to one end of the first resistor by using the transistor, and the other end of the first resistor is connected to the first fixed end of the first switching switch.

In this embodiment of this application, after output of the two sensors is processed by the logic controller, a control signal can be output, and the transistor is controlled to be conducted or cut off, to change the voltage on the functional pin.

With reference to the seventh possible implementation of the first aspect, in an eighth possible implementation of the first aspect, the connector of the headset further includes a third functional pin, and the headset further includes a first sound transmission channel, a second sound transmission channel, and a second switching switch, the second switching switch includes a third connection end, a fourth connection end, a second control end, and a second fixed end; the second fixed connection end is connected to the first sound transmission channel; the third connection end is connected to the second functional pin; the fourth connection end is connected to the third functional pin; the second control end is connected to the comparison output end of the comparator; and when an output result of the comparison output end indicates that the first functional pin is connected to the power supply circuit, the comparison output end controls the second fixed end of the second switching switch to connect to the third connection end, or when an output result of the comparison output end indicates that the first functional pin is connected to the MIC circuit, the comparison output end controls the second fixed end of the second switching switch to connect to the fourth connection end.

In this embodiment of this application, when the second functional pin is configured to transmit a sensor signal, a sound signal transmitted on the second sound transmission channel can be copied into the first sound transmission channel, to improve user experience.

With reference to the seventh or the eighth possible implementation of the first aspect, in a ninth possible implementation of the first aspect, the headset further includes a voltage switching circuit, the voltage switching circuit includes a switch, a first voltage divider resistor, and a second voltage divider resistor, the first voltage divider resistor and the second voltage divider resistor are connected in series, one end of the first voltage divider resistor is connected to a functional pin, the functional pin is the functional pin connected to the logic control circuit, the switch includes an input end, an enable end, and a switching output end, the input end is connected to the functional pin, the enable end is connected to the other end of the first voltage divider resistor, and the switching output end is connected to the first sensor, the second sensor, and the voltage regulation input end of the voltage regulator.

In this embodiment of this application, a voltage of a power supply provided by the terminal for the sensor circuit can be converted, to ensure that the sensor circuit stably works.

With reference to the fourth possible implementation of the first aspect, in a tenth possible implementation of the first aspect, the headset further includes a button circuit, the button circuit includes a plurality of buttons, and a plurality of first button resistors and a plurality of second button resistors that are in a one-to-one correspondence with the plurality of buttons, each button is connected to the first connection end of the first switching switch by using a first button resistor corresponding to the button, each button is connected to the second connection end of the first switching switch by using a second button resistor corresponding to the button, and the first fixed end of the first switching switch is connected to the first functional pin.

In this embodiment of this application, the button resistor can be switched based on a usage status of the functional pin, to ensure that the functional pin can correctly identify a sensor signal or a button signal in any usage status.

With reference to the tenth possible implementation of the first aspect, in an eleventh possible implementation of the first aspect, the sensor circuit includes a first sensor and a second sensor, the logic control circuit includes a logic controller, a transistor, and a first resistor, the logic controller includes a first input end, a second input end, and a logic output end, the first input end is connected to the first sensor, the second input end is connected to the second sensor, the logic output end is connected to one end of the first resistor by using the transistor, and the other end of the first resistor is connected to the first connection end of the first switching switch.

In this embodiment of this application, after output of the two sensors is processed by the logic controller, a control signal can be output, and the transistor is controlled to be conducted or cut off, to change the voltage on the functional pin.

With reference to the eleventh possible implementation of the first aspect, in a twelfth possible implementation of the first aspect, the headset further includes a voltage switching circuit, the voltage switching circuit includes a switch, a first voltage divider resistor, and a second voltage divider resistor, the first voltage divider resistor and the second voltage divider resistor are connected in series, one end of the first voltage divider resistor is connected to the first functional pin, the switch includes an input end, an enable end, and a switching output end, the input end is connected to the first functional pin, the enable end is connected to the other end of the first voltage divider resistor, and the switching output end is connected to the first sensor, the second sensor, and the voltage regulation input end of the voltage regulator.

In this embodiment of this application, a voltage of a power supply provided by the terminal for the sensor circuit can be converted, to ensure that the sensor circuit stably works.

With reference to the eleventh possible implementation of the first aspect, in a thirteenth possible implementation of the first aspect, the logic control circuit further includes a second resistor, the logic output end is further connected to one end of the second resistor by using the transistor, and the other end of the second resistor is connected to the second connection end of the first switching switch.

In this embodiment of this application, it can be ensured that the functional pin can transmit a sensor signal in any usage status, and the voltage value on the functional pin is changed to control the terminal to implement a corresponding operation event.

With reference to the thirteenth possible implementation of the first aspect, in a fourteenth possible implementation of the first aspect, the headset further includes a charging circuit, the charging circuit includes a battery and a charger, one end of the battery is connected to the charger, an input end of the charger is connected to the first functional pin, and an output end of the charger is connected to the first sensor, the second sensor, and the voltage regulation input end of the voltage regulator.

In this embodiment of this application, the charging circuit is configured to supply power to the sensor circuit, so that the sensor can detect the wearing status of the headset, and the terminal can perform different operation events based on different wearing statuses.

According to a second aspect, an embodiment of this application further provides a terminal, including a headset jack, configured to connect to a connector of a headset having a sensor circuit. The connector of the headset includes at least one functional pin, and when the connector of the headset is plugged into the headset jack of the terminal, the terminal is connected to the headset by using the at least one functional pin of the connector of the headset. The terminal further includes a power supply circuit, a sensor identification circuit, a third switching switch, and a MIC circuit. The power supply circuit is configured to supply power to the sensor circuit in the headset; the sensor identification circuit is configured to determine whether a sensor signal is transmitted to the headset; and the third switching switch is configured to control the terminal to provide the MIC circuit or the power supply circuit for the headset.

In this embodiment of this application, the terminal can provide, by using the functional pin, the MIC circuit or the power supply circuit for the headset having the sensor, identify a voltage value on the functional pin, and perform a corresponding operation event based on different voltage values.

With reference to the second aspect, in a first possible implementation of the second aspect, the power supply circuit is connected to the sensor identification circuit. The sensor identification circuit includes a current sampling resistor, a first analog-to-digital converter, and a second analog-to-digital converter, one end of the current sampling resistor is connected to the power supply circuit, the other end of the current sampling resistor is connected to the third switching switch, and the first analog-to-digital converter and the second analog-to-digital converter are separately configured to: collect voltages at the two ends of the current sampling resistor, and calculate a current that flows through the current sampling resistor. The MIC circuit includes a voltage sampling resistor, a third analog-to-digital converter, and a codec, one end of the voltage sampling resistor is connected to the third switching switch, the third analog-to-digital converter is configured to collect a voltage at the end of the voltage using resistor, and the other end of the voltage sampling resistor is connected to the codec.

In this embodiment of this application, it can be detected, based on the current that flows through the current sampling resistor, whether the sensor signal is transmitted to the headset, and the voltage sampling resistor can be used to identify different button signals in the MIC circuit based on a voltage value on the functional pin.

In a possible implementation, the sensor identification circuit further includes a third voltage divider resistor, a fourth voltage divider resistor, a fifth voltage divider resistor, and a sixth voltage divider resistor. The third voltage divider resistor and the fourth voltage divider resistor are connected in series, the fifth voltage divider resistor and the sixth voltage divider resistor are connected in series, one end of the third voltage divider resistor is connected to one end of the current sampling resistor, one end of the fifth voltage divider resistor is connected to the other end of the current sampling resistor, the first analog-to-digital converter is connected to the other end of the third voltage divider resistor, and the second analog-to-digital converter is connected to the other end of the fifth voltage divider resistor.

In this embodiment of this application, it can be ensured that when a voltage value of the power supply circuit is relatively large, voltage values detected by the first analog-to-digital converter and the second analog-to-digital converter fall within a detection range of the analog-to-digital converter, to ensure that the first analog-to-digital converter and the second analog-to-digital converter normally work.

With reference to the first possible implementation of the second aspect, in a second possible implementation of the second aspect, the headset having the sensor circuit includes the headset according to the ninth possible implementation of the first aspect. The terminal further includes an audio circuit, and the third switching switch includes a fifth connection end, a sixth connection end, a seventh connection end, an eighth connection end, a third control end, a fourth control end, a third fixed end, and a fourth fixed end. The fifth connection end is connected to the audio circuit, the sixth connection end is connected to the current sampling resistor, the third fixed end is connected to the second functional pin, and the third control end is configured to control the third fixed end to connect to the fifth connection end or the sixth connection end. The seventh connection end is connected to the voltage sampling resistor, the eighth connection end is connected to the current sampling resistor, the fourth fixed end is connected to the first functional pin, and the fourth control end is configured to control the fourth fixed end to connect to the seventh connection end or the eighth connection end.

In this embodiment of this application, a sensor signal transmission channel can be switched based on different working statuses of the terminal.

With reference to the first possible implementation of the second aspect, in a third possible implementation of the second aspect, the headset having the sensor circuit includes the headset according to the twelfth or the fourteenth possible implementation of the first aspect. The third switching switch includes a ninth connection end, a tenth connection end, a fifth control end, and a fifth fixed end. The ninth connection end is connected to the voltage sampling resistor, the tenth connection end is connected to the current sampling resistor, the fifth fixed end is connected to the first functional pin, and the fifth control end is configured to control the fifth fixed end to connect to the ninth connection end or the tenth connection end.

In this embodiment of this application, the terminal can be controlled to provide the MIC circuit or the power supply circuit for the headset having the sensor circuit.

According to a third aspect, an embodiment of this application provides a control method, applied to a headset having a sensor circuit and a terminal connected to the headset. The method includes:

sensing a wearing status of the headset by using a sensor in the sensor circuit;

outputting a trigger signal to a logic control circuit based on the wearing status of the headset, where the logic control circuit is a circuit included in the headset;

changing, by using the logic control circuit, a voltage value on a functional pin connected to the logic control circuit, where the functional pin is a functional pin of a connector of the headset, the connector of the headset includes at least one functional pin, and the connector of the headset is a connector used by the headset to connect to the terminal; and triggering, based on the voltage value on the functional pin, the terminal to perform a target operation event, where the target operation event is preset for the voltage value on the functional pin.

In this embodiment of this application, the voltage on the functional pin can be changed after output of the sensor circuit passes through the logic control circuit, so that the terminal performs different operation events based on different voltage values on the functional pin.

In conclusion, the embodiments of this application provide the headset, the terminal, and the control method. The headset has the sensor, configured to sense the wearing status of the headset. The control signal is output after output of the sensor is processed by the logic controller, and the transistor is controlled to be conducted or cut off, to change the voltage value on the functional pin, so that the terminal performs a corresponding operation event based on different voltage values on the functional pin.

BRIEF DESCRIPTION OF DRAWINGS

To describe the technical solutions in the embodiments of this application or in the prior art more clearly, the following briefly describes the accompanying drawings required for describing the embodiments or the prior art.

DESCRIPTION OF EMBODIMENTS

Figure 1:
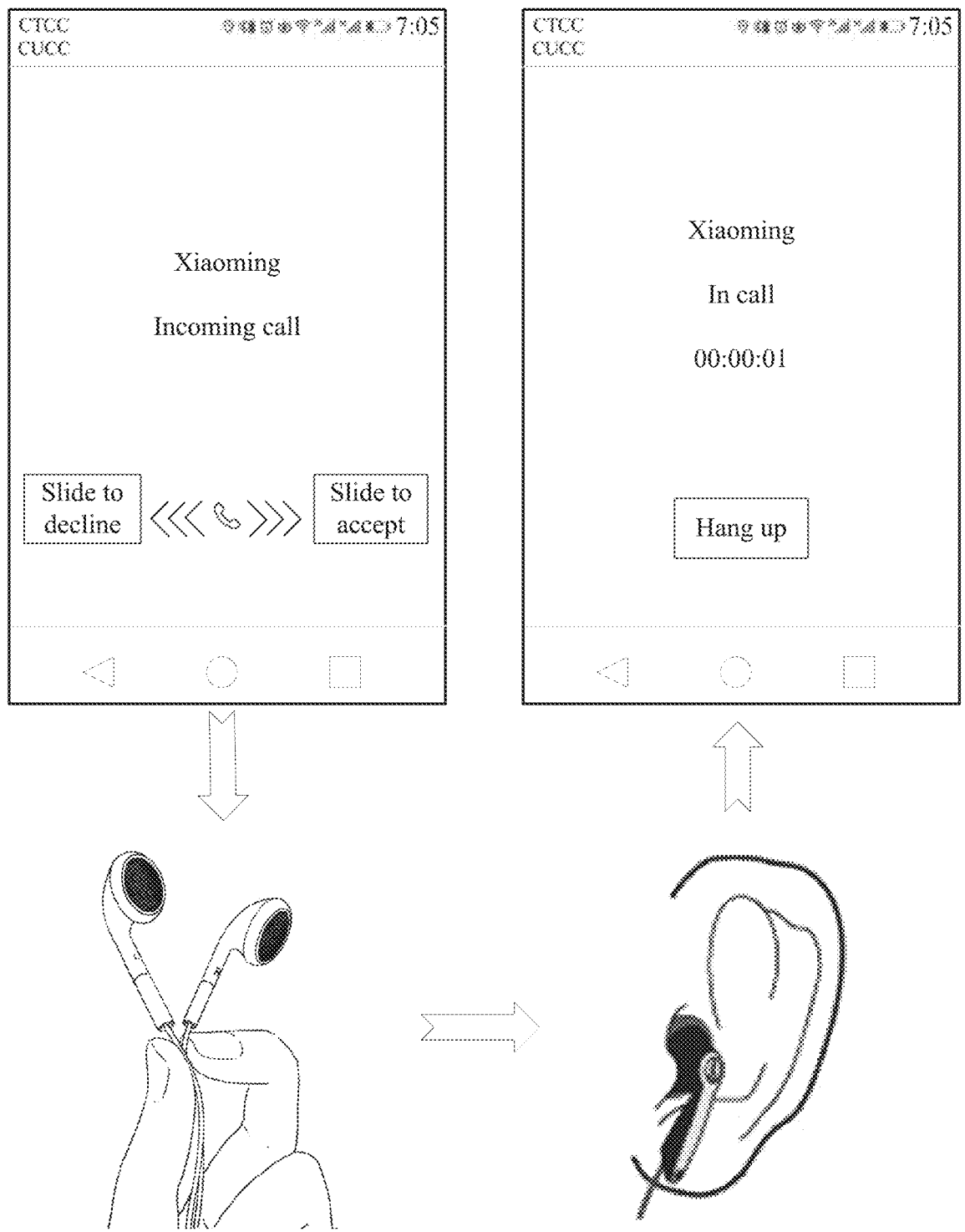
FIG. 1 is a diagram of a use scenario according to an embodiment of this application.

In the prior art, a wired headset usually includes an earbud, a button, and a connector of the headset configured to connect to a terminal. The connector of the headset may include a plurality of functional pins. The functional pin corresponds to the button, receives, by using the button, an instruction entered by a user, and then transmits the instruction to the terminal by using a functional pin corresponding to each button, so that the terminal implements different functions based on the instruction. Therefore, different quantities of functional pins indicate different functions implemented after the headset is connected to the terminal. For example, when the connector of the headset includes three functional pins, the headset, referred to as a headset with a three-conductor plug, may enable the terminal by using different buttons, to implement a function of increasing or decreasing volume. When the connector of the headset includes four functional pins, the headset, referred to as a headset with a four-conductor plug, may enable the terminal by using different buttons, to implement a function of increasing or decreasing volume and a call function. The earbud is configured to output a sound signal transmitted by the terminal to the headset. When the headset is the headset with a four-conductor plug, the headset may further include a microphone. The microphone is connected to a functional pin of the connector of the headset, and is configured to: collect a sound signal and transmit the sound signal to the terminal by using the functional pin, so that the terminal implements the call function. The terminal connected to the headset includes but is not limited to a device that can be used in cooperation with the headset, such as a personal digital assistant (Personal Digital Assistant, PDA), a smart mobile device (including a mobile phone, a mobile computer, a tablet computer, or the like), or a virtual reality head-mounted display device.

A headset in this application may be a wired headset, and a connector of the headset may include at least one functional pin. The headset in this application may further include a sensor, and at least one sensor is added to the headset. For example without limitation, the sensor may be added to an earbud of the headset. The sensor may feed back detected information to a terminal by using the pin, to control the terminal to implement a corresponding function. The information detected by the sensor may be but is not limited to a wearing status, environment information, motion information, or the like. The wearing status means that a user wears or takes off the headset. The environment information may mean a temperature, light, or the like of an environment in which the headset is located. The motion information may mean a motion status when the user wears the headset.

A sensor in this application may be but is not limited to a temperature sensor, a photosensor, a capacitive sensor, an acceleration sensor, or the like.

When any one or more of the foregoing sensors detect that the user wears the headset, the terminal is controlled to automatically play music or a video, automatically turn on a music balancer, automatically answer a call, and so on. When the sensor detects that the user takes off the headset, the terminal is controlled to automatically pause or stop music or a video, automatically exit a background application, turn off a music balancer, automatically hang up a call, and so on.

For example, as shown in FIG. 1, it is assumed that the terminal is a mobile phone. A call is automatically answered when the call is detected and it is sensed that the user wears the headset. A call is automatically hung up when it is sensed that the user takes off the headset. Alternatively, music or a video is paused when the terminal detects that the user is listening to the music or watching the video by using the headset and it is sensed that the user takes off the headset, and the music or the video resumes being played when it is sensed that the user wears the headset again. This is not limited to an application scenario of answering a call, listening to music, or watching a video, so that the terminal implements a function of automatically answering or hanging up a call, or pausing or playing music or a video, or may be another application scenario, so that the terminal implements another function.

In addition, when the acceleration sensor detects that the user is moving, the terminal is controlled to switch a music playlist to music with a strong rhythm, or when the acceleration sensor detects that the user stops moving, the terminal is controlled to switch a music playlist back to music with a slow rhythm.

In addition, when the photosensor detects that the light of the environment in which the headset is located is relatively dim, it is determined that the outside may be relatively quiet, and the terminal is controlled to automatically decrease volume.

In addition, when the acceleration sensor detects that the user does not move for a long time, and the photosensor detects that the light of the environment in which the headset is located is relatively dim, it is determined that the user may have fallen asleep, and the terminal is controlled to decrease music playing volume or stop music playing, or to be powered off or to switch to an airplane mode.

In addition, the temperature sensor may further detect information about the temperature of the environment in which the headset is located, and enable, based on the information about the temperature, the terminal to adjust sound quality of music that is being played.

The headset in this application is not limited to the wired headset, or may be a wireless headset, and at least one sensor may be added to the headset. The sensor feeds back detected information to the terminal through wireless communication, to control the terminal to implement a corresponding function. In this case, a type of the sensor, a location of the sensor, the information detected by the sensor, and the function implemented by the terminal are the same as those in the foregoing corresponding descriptions of the wired headset. Details are not described herein again.

In embodiments of this application, a wired headset with a four-conductor plug is used as an example for description, and any one of the foregoing sensors is added to each of two earbuds of the headset, and is configured to: detect a wearing status of the headset, and feed back the wearing status of the headset to a terminal by using a pin of the headset, to control the terminal to implement a corresponding function.

Embodiment 1

Figure 2:
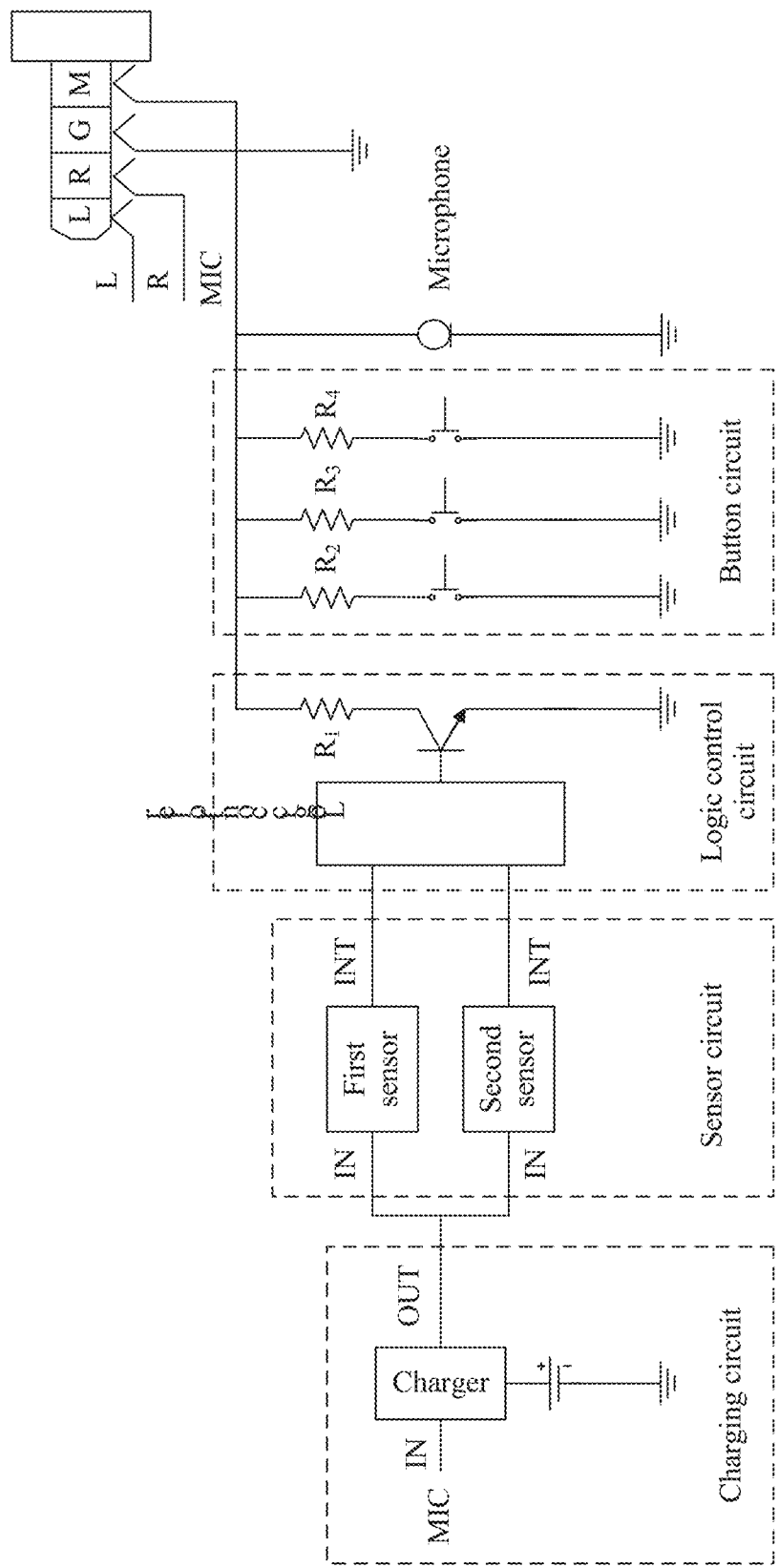
FIG. 2 is a circuit diagram of a headset according to an embodiment of this application.

First, FIG. 2 is a circuit diagram of a headset according to an embodiment of this application. The headset may include a connector of the headset configured to connect to a terminal, and the connector of the headset includes a plurality of functional pins, for example, a left pin (L), a right pin (R), a ground pin (G), and a microphone pin (MIC). The headset may further include a left earbud, a right earbud, and a microphone. The microphone is configured to: collect a sound signal and transmit the sound signal to the terminal by using the MIC pin. In addition, the headset may further include a sensor circuit and a logic control circuit. The sensor circuit is connected to a functional pin of the connector of the headset by using the logic control circuit. The sensor circuit is configured to: sense a wearing status of the headset, and output a trigger signal to the logic control circuit when the wearing status changes. The logic control circuit is configured to change, based on the trigger signal, a voltage value on the functional pin connected to the logic control circuit, to trigger the terminal to perform a target operation event based on a changed voltage value on the functional pin, where the target operation event is preset for the voltage value on the functional pin. The functional pin in this embodiment may be the MIC pin.

The sensor circuit includes two sensors: a first sensor (Sensor 1) and a second sensor (Sensor 2) respectively disposed in the left earbud and the right earbud of the headset. Each sensor has an input end (IN) and an output end (INT). The input end (IN) is configured to input a signal detected by the sensor (for example, a temperature value detected by a temperature sensor). The output end (INT) is configured to output a high or low level based on the input signal.

It is assumed that the sensor is a temperature sensor. A reference temperature first needs to be set, and a temperature detected by the temperature sensor is compared with the reference temperature. When a user wears the headset, the temperature sensor detects a temperature of a human body. If the detected temperature is higher than the reference temperature, the sensor may be enabled to output a high level, and it indicates that the headset is in a worn state. If the detected temperature is not higher than the reference temperature, the sensor may be enabled to output a low level, and it indicates that the headset is in a taken-off state.

It is assumed that the sensor is a photosensor. When the headset is in a worn state, an optical signal detected by the photosensor is very weak, and the photosensor is set to output a high level. When the headset is in a taken-off state, an optical signal detected by the photosensor is very strong, and the photosensor is set to output a low level.

It is assumed that the sensor is a capacitive sensor. When the headset is in a worn state, a capacitance value detected by the capacitive sensor is very high, and the capacitive sensor is set to output a high level. When the headset is in a taken-off state, a capacitance value detected by the capacitive sensor is very low, and the capacitive sensor is set to output a low level.

It is assumed that the sensor is an acceleration sensor. When the headset is in a worn state, the acceleration sensor detects that a tilt angle of the headset relative to a horizontal plane is very small, and the acceleration sensor is set to output a high level. When the headset is in a taken-off state, the acceleration sensor detects that a tilt angle of the headset relative to a horizontal plane is very large, and the acceleration sensor is set to output a low level.

The logic control circuit includes a logic controller (Logic), a transistor, and a first resistor ($R_1$). The logic controller includes a first input end, a second input end, and a logic output end. The first input end is connected to the first sensor, and the second input end is connected to the second sensor. The first input end and the second input end are separately configured to input high and low levels that are output by output ends (INT) of the two sensors. After the high and low levels are processed by the logic controller, a control signal is output, and the transistor is controlled to be conducted or cut off. For example, the logic controller may be an OR gate. When at least one sensor outputs a high level, the output end of the logic controller may output a high level, so that the transistor is conducted. The transistor and the first resistor $R_1$ are connected in series. After the transistor is conducted, the first resistor $R_1$ is used to change a voltage value on the MIC pin, so that the terminal performs a corresponding operation event by using the voltage value on the MIC pin.

In addition, if the sensor is set to output a low level when detecting that the headset is in a worn state, or is set to output a high level when detecting that the headset is in a taken-off state, the logic controller may be set to a NAND gate. When at least one sensor outputs a low level, the output end of the logic controller may output a high level, so that the transistor is conducted.

The headset in FIG. 2 may further include a button circuit, the button circuit includes a plurality of buttons and a plurality of first button resistors ($R_2$, $R_3$, and $R_4$) that are in a one-to-one correspondence with the plurality of buttons, and each button is connected to the MIC pin by using a first button resistor corresponding to the button. When any button is pressed, the button is connected to a first button resistor corresponding to the button, and the first button resistor corresponding to the button is used to change a voltage value on the MIC pin, so that the terminal performs a corresponding operation event by using the voltage value on the MIC pin. It can be learned that resistance values of the first resistor and the first button resistors are all different, so that it can be ensured that the terminal correctly identifies a difference between voltage values on the MIC pin, and therefore correctly identifies whether a signal is sent by a sensor after a specific button is pressed or after the transistor is conducted. When the headset is connected to the terminal, the terminal may obtain the voltage value on the MIC pin through measurement by using an analog-to-digital converter.

Specifically, a mapping table may be stored in the terminal. As shown in Table 1, the mapping table includes different voltage values on the MIC pin that correspond to different conducted devices and a target operation event corresponding to each of the different voltage values. A voltage value on the MIC pin changes when a different device is conducted, so that the terminal can find and perform a corresponding target operation event based on the voltage value on the MIC pin. Target operation events corresponding to the different voltage values on the MIC pin in Table 1 are merely examples, and are not limited herein.

TABLE 1

| Conducted device | Transistor | Button 1 | Button 2 | Button 3 |
|---|---|---|---|---|
| Voltage value on the MIC pin | $V_1$ | $V_2$ | $V_3$ | $V_4$ |
| Target operation event | Playing music/a video | Increasing volume | Decreasing volume | Answering/ hanging up |

(The button 1 is a button corresponding to $R_2$. The button 2 is a button corresponding to $R_3$. The button 3 is a button corresponding to $R_4$.)

In addition, if a target operation event performed by the terminal when the transistor is conducted is playing music, when the transistor changes from a conducted state to a cut-off state, to be specific, when a voltage value on the MIC pin changes from $V_1$ to 0, in other words, when it is detected that the headset changes from a worn state to a taken-off state, a target operation event performed by the terminal is pausing music/video playing, or stopping music/video playing and closing a background application of the terminal, thereby reducing power consumption. If a target operation event performed by the terminal when the transistor is conducted is automatically answering a call, when the transistor changes from a conducted state to a cut-off state, to be specific, when a voltage value on the MIC pin changes from $V_1$ to 0, in other words, when it is detected that the headset changes from a worn state to a taken-off state, a target operation event performed by the terminal is automatically hanging up a call.

It can be learned that when the button changes from a conducted state to a cut-off state, in other words, when a voltage value on the MIC pin changes from $V_2$, $V_3$, or $V_4$ to 0, an operation event performed by the terminal is stopping a corresponding target operation event when the button is conducted. For example, when the button 1 is pressed (conducted), the terminal performs an operation of increasing volume until the button 1 is released (cut off).

The headset in FIG. 2 may further include a charging circuit. The charging circuit includes a battery and a charger. One end of the battery is connected to the charger and the other end of the battery is grounded. An input end of the charger is connected to the MIC pin, and an output end of the charger is connected to the first sensor and the second sensor. A dedicated charger may be used herein to charge the headset. The headset is pulled out for use after being fully charged. When the headset is plugged into the terminal, the battery supplies power to the sensor circuit in the headset. After power of the battery in the headset is exhausted, the headset needs to be recharged on the charger. In this embodiment of this application, only a circuit in the headset instead of a circuit in the terminal needs to be improved.

For example, it is assumed that both the sensors in the left and right earbuds are capacitive sensors, the logic controller is an OR gate, and the charging circuit provides a power supply for the sensors in the headset. When the user wears the headset, output of a capacitive sensor in at least one earbud of the headset changes from a low level to a high level, and a high level is output after an OR operation is performed by using the logic controller (the OR gate), so that the transistor is conducted, and the first resistor $R_1$ is used to change a voltage value on the MIC pin from 0 to $V_1$. After detecting that the voltage value on the MIC pin changes, the terminal finds, according to Table 1, that a corresponding target operation event is automatically playing music. In this case, the terminal automatically plays the music. When the user takes off the headset, both output of the sensors in the two earbuds of the headset changes from a high level to a low level, and a low level is output after an OR operation is performed by using the logic controller (the OR gate), so that the transistor is cut off, and a voltage value on the MIC pin changes from $V_1$ to 0. After detecting that the voltage value on the MIC pin changes, the terminal pauses music playing, or stops music playing and exits a background application of the terminal, thereby reducing power consumption.

In this embodiment of this application, only the circuit in the headset may be improved without improving the terminal. The sensor circuit, the logic control circuit, and the charging circuit are added to the headset. A sensor is used to sense the wearing status of the headset, and controls, after output of the sensor passes through the logic control circuit, the transistor to be conducted or cut off, to change the voltage value on the MIC pin of the headset, so that the terminal performs a target operation event based on a change in the voltage value on the MIC pin. In this embodiment of this application, a manual operation of the user can be replaced, to avoid a case in which a received message is incomplete when the user manually enters the operation, thereby improving user experience, reducing power consumption, and so on.

Embodiment 2

A terminal needs to supply power to a headset provided in an embodiment of this application. In this application, a power supply circuit is provided for the headset by reusing a first functional pin, and the first functional pin may be a MIC pin. When the terminal provides a MIC circuit for the headset by using the MIC pin, the terminal cannot provide the power supply circuit for the headset by using the MIC pin, and a sensor in the headset cannot work. When the terminal provides the power supply circuit for the headset by using the MIC pin, the terminal cannot provide a MIC circuit for the headset by using the MIC pin, and a microphone in the headset cannot be used. Further, when the microphone in the headset cannot be used, a sound signal may be collected by using a microphone in the terminal. The terminal in this embodiment of this application is first described below.

Figure 3:
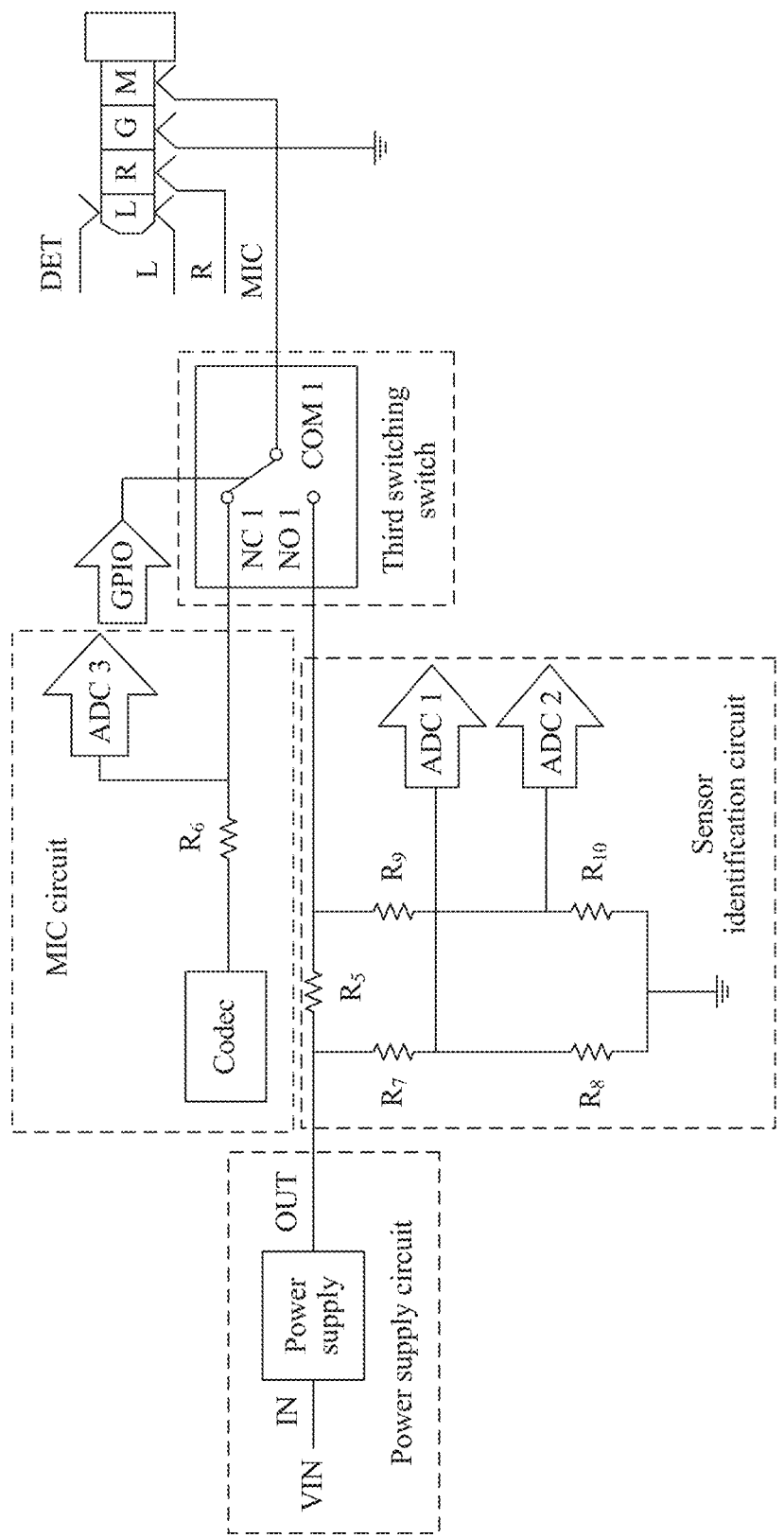
FIG. 3 is a circuit diagram of a terminal according to an embodiment of this application.

FIG. 3 is a circuit diagram of a terminal according to an embodiment of this application. The terminal includes a headset jack that may be connected to a connector of a headset having a sensor. The connector of the headset includes at least one functional pin. When the connector of the headset is plugged into the headset jack of the terminal, the terminal is connected to the headset by using the at least one functional pin of the connector of the headset. The terminal may include a detection pin (DET), and the at least one functional pin of the headset may include a left pin (L), a right pin (R), a ground pin (G), and a microphone pin (MIC). The terminal may determine, by detecting a level of the detection pin (DET), whether the connector of the headset is plugged. When the connector of the headset is plugged into the headset jack of the terminal, the left pin (L) of the headset and the detection pin (DET) of the terminal are short-circuited, and the detected level of the detection pin (DET) is a low level. When no connector of the headset is plugged into the headset jack of the terminal, the detected level of the detection pin (DET) is a high level.

In addition, the terminal further includes a power supply circuit, a sensor identification circuit, a MIC circuit, and a third switching switch.

The power supply circuit is configured to supply power to a sensor circuit in the headset, and includes an input end (IN), a power supply, and an output end (OUT). The input end (IN) is connected to an input voltage (VIN), and the output end (OUT) is connected to the sensor identification circuit.

The sensor identification circuit includes a current sampling resistor ($R_5$), a first analog-to-digital converter (ADC 1), and a second analog-to-digital converter (ADC 2). The first analog-to-digital converter (ADC 1) and the second analog-to-digital converter (ADC 2) are respectively connected to two ends of the current sampling resistor ($R_5$), and are configured to: measure voltages at the two ends of the current sampling resistor ($R_5$), and calculate a current that flows through the current sampling resistor ($R_5$), to determine, based on a value of the current that flows through the current sampling resistor ($R_5$), whether a sensor signal is transmitted to the headset. When the sensor signal is transmitted to the headset, whether a signal is sent by a sensor after a specific button in the headset is pressed or after a transistor is conducted may be further identified based on the value of the current that flows through the current sampling resistor ($R_5$). A specific identification principle is described in detail below in a circuit in the headset. One end of the current sampling resistor ($R_5$) is further connected to the output end of the power supply circuit, and the other end of the current sampling resistor ($R_5$) is further connected to the third switching switch. The current sampling resistor is usually an ohm-level resistor, to ensure current collection precision. When a resistance value of the current sampling resistor ($R_5$) is known, it may also be understood that a voltage value on the MIC pin is measured by using the second analog-to-digital converter (ADC 2), so that the terminal performs a target operation event based on different voltage values on the MIC pin.

In a possible implementation, the sensor identification circuit may further include a third voltage divider resistor ($R_7$), a fourth voltage divider resistor ($R_8$), a fifth voltage divider resistor ($R_9$), and a sixth voltage divider resistor ($R_{10}$), to reduce voltage values detected by the first analog-to-digital converter (ADC 1) and the second analog-to-digital converter (ADC 2), ensure that the voltage values detected by the first analog-to-digital converter (ADC 1) and the second analog-to-digital converter (ADC 2) fall within a measurement range of the analog-to-digital converter, and ensure that the first analog-to-digital converter (ADC 1) and the second analog-to-digital converter (ADC 2) normally work.

Specifically, the third voltage divider resistor ($R_7$) and the fourth voltage divider resistor ($R_8$) are connected in series, the fifth voltage divider resistor ($R_9$) and the sixth voltage divider resistor ($R_{10}$) are connected in series, one end of the third voltage divider resistor ($R_7$) is connected to one end of the current sampling resistor (R5), and the other end of the fourth voltage divider resistor ($R_8$) is grounded. One end of the fifth voltage divider resistor ($R_9$) is connected to the other end of the current sampling resistor ($R_5$), and the other end of the sixth voltage divider resistor ($R_{10}$) is grounded. The first analog-to-digital converter (ADC 1) is connected to the other end of the third voltage divider resistor ($R_7$), and the second analog-to-digital converter (ADC 1) is connected to the other end of the fifth voltage divider resistor ($R_9$).

The MIC circuit includes a voltage sampling resistor ($R_6$), a third analog-to-digital converter (ADC 3), and a codec (Codec). The codec (Codec) is configured to: process a sound signal transmitted by the headset by using the MIC pin, and convert the sound signal into an electrical signal. One end of the voltage using resistor ($R_6$) is connected to the third switching switch. The third analog-to-digital converter (ADC 3) is configured to collect a voltage of the voltage sampling resistor ($R_6$). To be specific, when the MIC circuit is closed by using the third switching switch, the third analog-to-digital converter (ADC 3) collects the voltage value on the MIC pin. When the voltage value on the MIC pin changes, the terminal may identify a specific button in the headset by using the voltage value on the MIC pin, where a signal is sent after the button in the headset is pressed. A specific identification principle is described in detail below in a circuit in the headset. Different from the current sampling resistor, the voltage sampling resistor ($R_6$) connecting the codec of the terminal and the MIC pin of the headset in series is usually a kilohm-level resistor.

The third switching switch includes a ninth connection end (NC 1), a tenth connection end (NO 1), a fifth control end, and a fifth fixed end (COM 1). The ninth connection end (NC 1) is connected to the voltage sampling resistor ($R_6$), the tenth connection end (NO 1) is connected to the current sampling resistor ($R_5$), the fifth fixed end (COM 1) is connected to the MIC pin, and the fifth control end is connected to General Purpose Input/Output (General Purpose Input/Output, GPIO). When it is detected that the terminal is in a voice input state, the GPIO may control, by using the fifth control end, the third switching switch to switch to the ninth connection end (NC 1), to be specific, the fifth fixed end (COM 1) is connected to the ninth connection end (NC 1), to provide the MIC circuit for the headset by using the MIC pin. When it is detected that the terminal is in a non-voice input state, the GPIO may control, by using the fifth control end, the third switching switch to switch to the tenth connection end (NO 1), to be specific, the fifth fixed end (COM 1) is connected to the tenth connection end (NO 1), to provide the power supply circuit for the headset by using the MIC pin. The voice input state may occur in a scenario in which a microphone needs to be used, for example, in a call, a voice, or a video.

In a possible implementation, the terminal may further include a stable resistor, and the switching switch may include a ninth connection end, a tenth connection end, an eleventh connection end, a twelfth connection end, a fifth control end, a sixth control end, a fifth fixed end, and a sixth fixed end. The ninth connection end is connected to the voltage sampling resistor ($R_6$), the tenth connection end is connected to the sixth fixed end, the eleventh connection end is connected to the current sampling resistor ($R_5$), the twelfth connection end is connected to one end of the stable resistor, and the other end of the stable resistor is grounded. The fifth fixed end is connected to the MIC pin, and the fifth control end and the sixth control end are connected to GPIO. When it is detected that the terminal is in a call mode, the GPIO may control, by using the fifth control end, the fifth fixed end to connect to the ninth connection end, and the GPIO may simultaneously control, by using the sixth control end, the fifth fixed end to connect to the twelfth connection end. When it is detected that the terminal is in a non-call mode, the GPIO may control, by using the fifth control end, the fifth fixed end to connect to the tenth connection end, and the GPIO may simultaneously control, by using the sixth control end, the fifth fixed end to connect to the eleventh connection end. In this way, it can be ensured that regardless of how the switching switch performs switching, the connection ends of the switching switch are in a connected state. To be specific, in addition to the ninth connection end connected to the voltage sampling resistor ($R_6$) or the eleventh connection end connected to the current sampling resistor ($R_5$), the twelfth connection end may be grounded by using the stable resistor, thereby avoiding signal interference caused when the connection end is unconnected.

Figure 4A:
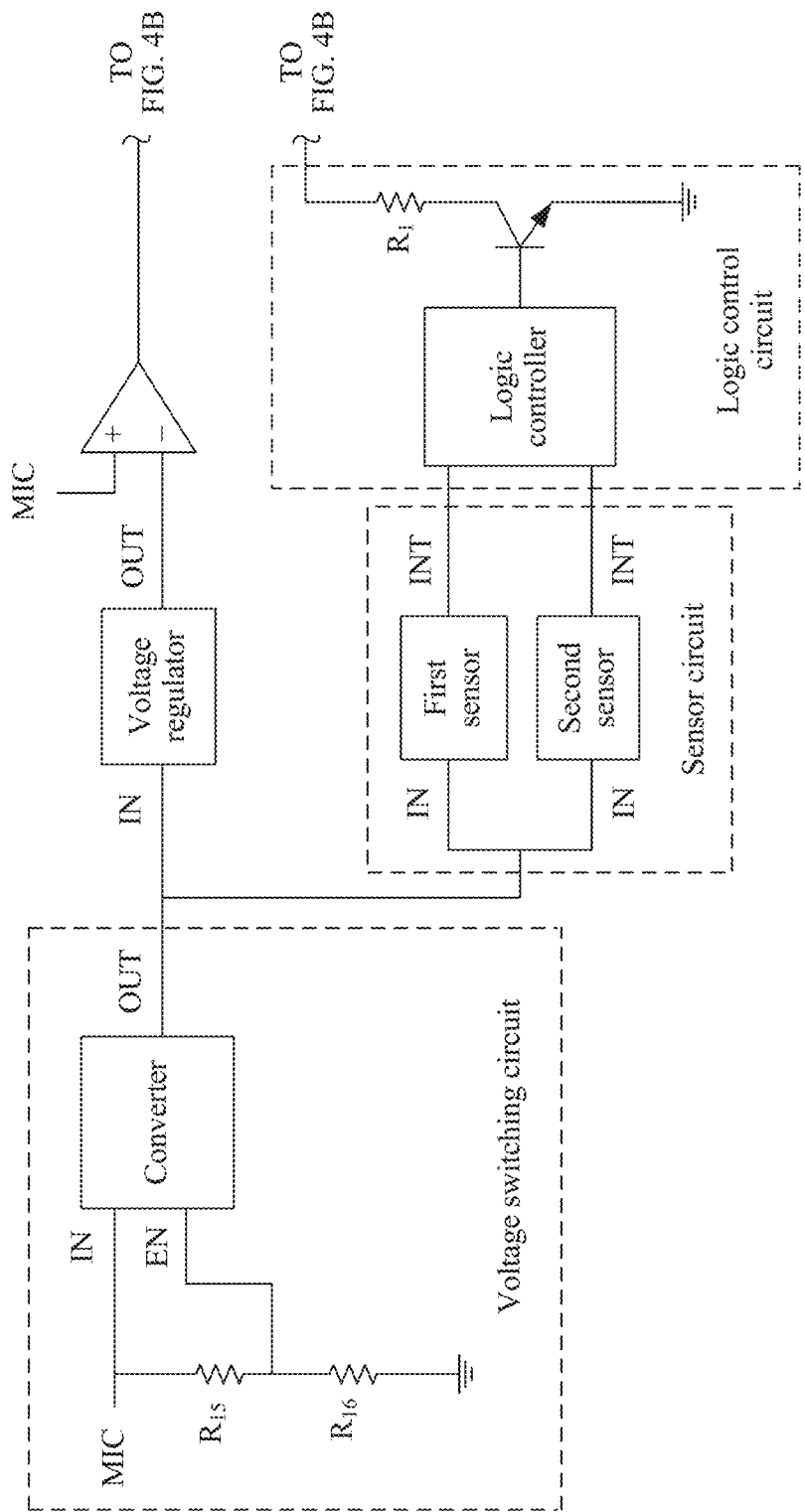
FIG. 4A and FIG. 4B are a circuit diagram of another headset according to an embodiment of this application.
Figure 4B:
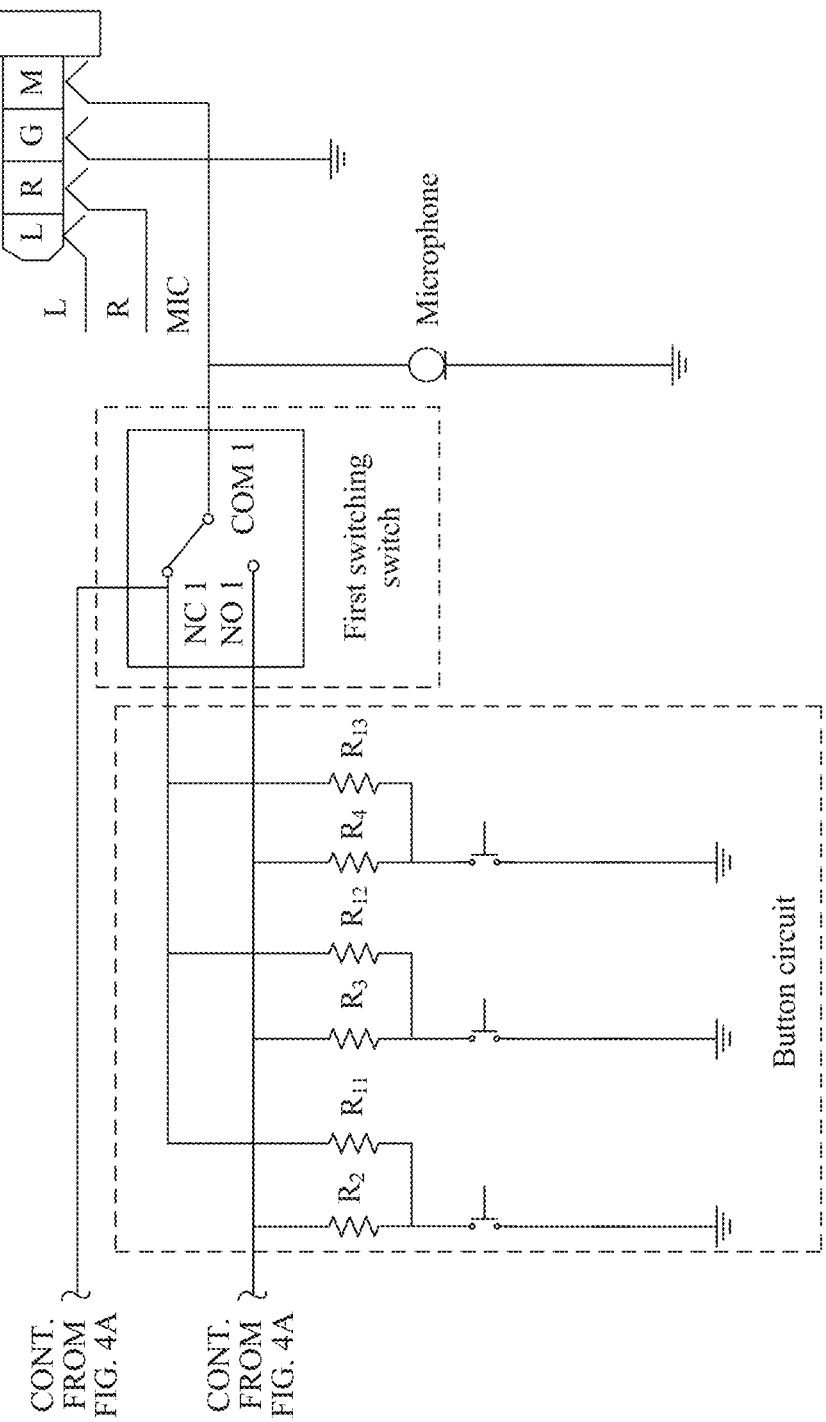

The headset that has the sensor and that is connected to the terminal provided in FIG. 3 is described below. FIG. 4A and FIG. 4B are a circuit diagram of another headset according to an embodiment of this application. The headset may include a connector of the headset configured to connect to the terminal, and the connector of the headset includes a plurality of functional pins, for example, a left pin (L), a right pin (R), a ground pin (G), and a microphone pin (MIC). The headset may further include a left earbud, a right earbud, and a microphone. The microphone is configured to: collect a sound signal and transmit the sound signal to the terminal by using the MIC pin. In addition, the headset may include a voltage switching circuit, a button circuit, a voltage regulator (LDO), a comparator, and a first switching switch in addition to the sensor circuit and the logic control circuit that are described in Embodiment 1. The first resistor ($R_1$) in the logic control circuit is connected to the first switching switch.

The voltage switching circuit includes a switch (Switch), a first voltage divider resistor ($R_{15}$), and a second voltage divider resistor ($R_{16}$). The first voltage divider resistor ($R_{15}$) and the second voltage divider resistor ($R_{16}$) are connected in series, and one end of the first voltage divider resistor ($R_{15}$) is connected to the MIC pin. The switch (Switch) includes an input end (IN), an enable end (EN), and a switching output end (OUT). The input end (IN) is connected to the MIC pin and one end of the first voltage divider resistor ($R_{15}$), the enable end (EN) is connected to the other end of the first voltage divider resistor ($R_{15}$), and the switching output end (OUT) is connected to the first sensor (Sensor 1), the second sensor (Sensor 2), and the voltage regulator (LDO).

Specifically, the input end (IN) is connected to the MIC pin, and is configured to connect, by using the MIC pin, to the power supply circuit provided by the terminal for the headset. The enable end (EN) is connected to the other end of the first voltage divider resistor ($R_{15}$), and is configured to adjust a voltage value that is input to the enable end to a range of a working voltage of the switch. The switch can normally work only when the voltage value that is input to the enable end (EN) is within the range of the working voltage of the switch. The switching output end (OUT) is configured to output a voltage value range that matches the sensor circuit, to improve power supplying efficiency of the power supply circuit provided by the terminal for the sensor circuit in the headset by using the MIC pin. The switch (Switch) may be a DC-DC converter or the like.

The voltage regulator (LDO) includes a voltage regulation input end (IN) and a voltage regulation output end (OUT). The voltage regulation output end (OUT) is connected to the comparator, and is configured to output a reference voltage.

The comparator includes a first voltage input end, a second voltage input end, and a comparison output end. The first voltage input end is connected to the MIC pin and is configured to input a voltage value on the MIC pin. The second voltage input end is connected to the voltage regulation output end (OUT) of the voltage regulator (LDO), so that the comparator compares the voltage value on the MIC pin with a value of the reference voltage. The comparison output end is connected to the first switching switch, and is configured to: output a comparison result of the comparator, and control, based on the comparison result, the first switching switch to perform switching.

For example, when the MIC pin is used by the terminal to provide the MIC circuit for the headset, the voltage value on the MIC pin is usually approximately 2 V, but when the MIC pin is used by the terminal to provide the power supply circuit for the headset, the voltage value on the MIC pin is usually approximately 5 V. In this case, the reference voltage may be set to a voltage value between the voltage value on the MIC pin in the MIC circuit and the voltage value on the MIC pin in the power supply circuit, such as 3 V or 4 V. When the comparison result of the comparator is that the voltage value on the MIC pin is greater than the value of the reference voltage, it indicates that the terminal provides the power supply circuit for the headset by using the MIC pin in this case. When the comparison result of the comparator is that the voltage value on the MIC pin is less than the value of the reference voltage, it indicates that the terminal provides the MIC circuit for the headset by using the MIC pin in this case.

The first switching switch includes a first connection end (NO 1), a second connection end (NC 1), a first control end, and a first fixed end (COM 1). The first control end is connected to the comparison output end of the comparator, and the first control end is used to control, based on an output result of the comparator, the first switching switch to perform switching. The first fixed end (COM 1) is connected to a first functional pin, and the first functional pin in this embodiment of this application is the MIC pin. The first resistor ($R_1$) in the logic control circuit is connected to the first connection end (NO 1) of the first switching switch.

The button circuit includes a plurality of buttons, and a plurality of first button resistors and a plurality of second button resistors that are in a one-to-one correspondence with the plurality of buttons. Each button is connected to the first connection end (NO 1) of the first switching switch by using a first button resistor ($R_2$, $R_3$, or $R_4$) corresponding to the button, and each button is connected to the second connection end (NC 1) of the first switching switch by using a second button resistor ($R_{11}$, $R_{12}$, or $R_{13}$) corresponding to the button.

When it is determined, based on the comparison result of the comparator, that the terminal provides the power supply circuit for the headset by using the MIC pin in this case, the first control end is used to control the first fixed end (COM 1) of the first switching switch to connect to the first connection end (NO 1). When it is determined, based on the comparison result of the comparator, that the terminal provides the MIC circuit for the headset by using the MIC pin in this case, the first control end is used to control the first fixed end (COM 1) of the first switching switch to connect to the second connection end (NC 1).

Two groups of button resistors, namely, the plurality of first button resistors and the plurality of second button resistors, need to be sampled in the button circuit, where the first button resistors are ohm-level resistors, and the second button resistors are kilohm-level resistors, so that when the MIC pin of the headset is connected to the power supply circuit or the MIC circuit, the terminal can correctly identify whether a change in the voltage on the MIC pin is generated because the transistor is conducted or because a specific button is conducted.

When the MIC pin is connected to the power supply circuit, the fifth fixed end (COM 1) of the third switching switch is connected to the tenth connection end (NO 1). The comparator in the headset determines that the MIC pin is connected to the power supply circuit in this case, and controls the first fixed end (COM 1) of the first switching switch to connect to the first connection end (NO 1). When the transistor is conducted or any button is pressed, the first resistor ($R_1$) or any first button resistor ($R_2$, $R_3$, or $R_4$) and the current sampling resistor ($R_5$) are connected in series to change the voltage value on the MIC pin, to change a voltage value detected by the second analog-to-digital converter (ADC 2), and change a current that flows through the current sampling resistor ($R_5$). Because the current sampling resistor ($R_5$) is an ohm-level resistor, all the first button resistors ($R_2$, $R_3$, and $R_4$) need to be set to ohm-level resistors to ensure that when the MIC pin is connected to the power supply circuit, the terminal can correctly identify whether the change in the voltage on the MIC pin is generated because the transistor is conducted or because a specific button is conducted.

For example, it is assumed that a difference between voltages at two ends of $R_5$ is 3 V, $R_5$ has a resistance value of 5Ω, and $R_1$, $R_2$, $R_3$, and $R_4$ have resistance values of 5Ω, 10Ω, 15Ω, and 20Ω. When the transistor is conducted, $R_5$ and $R_1$ are connected in series, and the current that flows through $R_5$ is 3 V/(5+5) Ω=0.3 A. Similarly, it can be learned that when a first button corresponding to $R_2$ is pressed, the current that flows through $R_5$ is 0.2 A. When a first button corresponding to $R_3$ is pressed, the current that flows through $R_5$ is 0.15 A. When a first button corresponding to $R_4$ is pressed, the current that flows through $R_5$ is 0.12 A. It is assumed that a difference between voltages at two ends of $R_5$ is 3 V, $R_5$ has a resistance value of 5Ω, and $R_1$, $R_2$, $R_3$, and $R_4$ are kilohm-level resistors, and have resistance values of 2 KΩ, 3 KΩ, 4 KΩ, and 5 KΩ. In this case, it may be determined, through calculation, that the current that flows through $R_5$ is separately 1.5 mA, 1 mA, 0.75 mA, and 0.6 mA when the transistor is conducted or any button is pressed. It can be learned that when the resistance value of the first button resistor and the resistance value of the current sampling resistor are not in a same order of magnitude, the current that flows through $R_5$ does not change much when the transistor is conducted or the any button is pressed. Consequently, it is difficult for the terminal to make a correct result of determining based on a slight current change. Only when the resistance value of the first button resistor and the resistance value of the current sampling resistor are in a same order of magnitude, the current that flows through $R_5$ significantly changes when the transistor is conducted or the any button is pressed, so that it can be ensured that the terminal can correctly identify whether the change in the voltage on the MIC pin is generated because the transistor is conducted or because a specific button is conducted.

When the MIC pin is connected to the MIC circuit, the fifth fixed end (COM 1) of the third switching switch is connected to the ninth connection end (NC 1). The comparator in the headset determines that the MIC pin is connected to the MIC circuit in this case, and controls the first fixed end (COM 1) of the first switching switch to connect to the second connection end (NC 1). When any button is pressed, any second button resistor ($R_{11}$, $R_{12}$, or $R_{13}$) and the voltage sampling resistor ($R_6$) are connected in series to change the voltage value on the MIC pin, to change a voltage value detected by the second analog-to-digital converter (ADC 3). Because the voltage sampling resistor ($R_6$) is a kilohm-level resistor, all the second button resistors ($R_{11}$, $R_{12}$, and $R_{13}$) need to be set to kilohm-level resistors to ensure that when the MIC pin is connected to the MIC circuit, the terminal can correctly identify whether the change in the voltage on the MIC pin is generated because the transistor is conducted or because a specific button is conducted.

For example, it is assumed that both the sensors in the left and right earbuds are capacitive sensors, the logic controller is an OR gate, the power supply circuit in the terminal supplies power to the sensor circuit in the headset by using the MIC pin. When a call is detected on the terminal, and a user wears the headset, output of a capacitive sensor in at least one earbud of the headset changes from a low level to a high level, and a high level is output after an OR operation is performed by using the logic controller (the OR gate), so that the transistor is conducted, and the first resistor $R_1$ is used to change a voltage value on the MIC pin from 0 to $V_1$. After the terminal detects that the voltage value on the MIC pin changes, if a target operation event found by the terminal based on a change in the voltage value is automatically answering the call, the terminal automatically answers the call. The fifth fixed end (COM 1) of the third switching switch switches from the tenth connection end (NO 1) to the ninth connection end (NC 1), in other words, the terminal automatically switches from the power supply circuit to the MIC circuit. In this case, the terminal provides the MIC circuit for the headset by using the MIC pin, so that the user can input a voice (a sound signal) by using the microphone, and the sound signal is transmitted to the terminal by using the MIC pin. Meanwhile, the comparison output end of the comparator controls the first fixed end (COM 1) of the first switching switch to switch from the first connection end (NO 1) to the second connection end (NC 1). Each button is connected to the MIC pin by using a second button resistor. When a button is pressed, a second button resistor corresponding to the button may be used to change the voltage value on the MIC pin, so that the terminal detects the voltage value on the MIC pin by using the third analog-to-digital converter (ADC 3), and performs a target operation event based on the voltage value on the MIC pin.

After the call ends, in other words, when the terminal is in a non-voice input state, the fifth fixed end (COM 1) of the third switching switch switches from the ninth connection end (NC 1) to the tenth connection end (NO 1), in other words, the terminal automatically switches from the MIC circuit to the power supply circuit. In this case, the terminal provides the power supply circuit for the headset by using the MIC pin. Meanwhile, the comparison output end of the comparator controls the first fixed end (COM 1) of the first switching switch to switch from the second connection end (NC 1) to the first connection end (NO 1). Each button is connected to the MIC pin by using a first button resistor. The sensor circuit in the headset may resume detecting a wearing status of the headset, and control the transistor to be conducted, and the first resistor $R_1$ is used to change the voltage value on the MIC pin. Alternatively, the user manually controls each button to be conducted, and a first button resistor corresponding to the button is used to change the voltage value on the MIC pin, so that the terminal detects the voltage value on the MIC pin by using the second analog-to-digital converter (ADC 2), and performs a target operation event based on the voltage value on the MIC pin.

This embodiment of this application provides the terminal and the headset, the power supply circuit, the sensor identification circuit, and the third switching switch are newly added to the terminal, and the voltage switching circuit, the sensor circuit, the logic control circuit, the button circuit, the voltage regulator, the comparator, and the first switching switch are newly added to the headset. The terminal supplies power to the sensor in the headset, and provides the MIC circuit or the power supply circuit for the headset by reusing the MIC pin. In this application, when the microphone does not work, the terminal supplies power to the sensor circuit in the headset, and the sensor senses the wearing status of the headset, and controls, after output of the sensor passes through the logic control circuit, the transistor to be conducted, to change the voltage value on the MIC pin of the headset, so that the terminal performs a target operation event based on a change in the voltage value on the MIC pin. For example, when the headset is worn, the terminal automatically plays music or a video, and when the headset is taken off, the terminal automatically pauses or stops music or video playing. For another example, when a call is detected, the headset is worn to automatically answer the call. In this embodiment of this application, a manual operation of the user can be replaced, to avoid a case in which a received message is incomplete when the user manually enters the operation, thereby improving user experience, reducing power consumption, and so on.

Embodiment 3

A terminal needs to supply power to a headset provided in an embodiment of this application. In this application, a power supply circuit is provided for the headset by reusing a first functional pin, and the first functional pin may be a MIC pin. An improvement is made in this embodiment of this application based on Embodiment 2, and a charging circuit and a second resistor are newly added to a headset end. When the terminal provides a MIC circuit for the headset by using the MIC pin, the terminal cannot provide the power supply circuit for the headset by using the MIC pin, but the charging circuit in the headset can supply power to a sensor circuit, in other words, a sensor in the headset can still work.

The terminal provided in this embodiment of this application is the same as the terminal in Embodiment 2. Details are not described herein again.

Figure 5A:
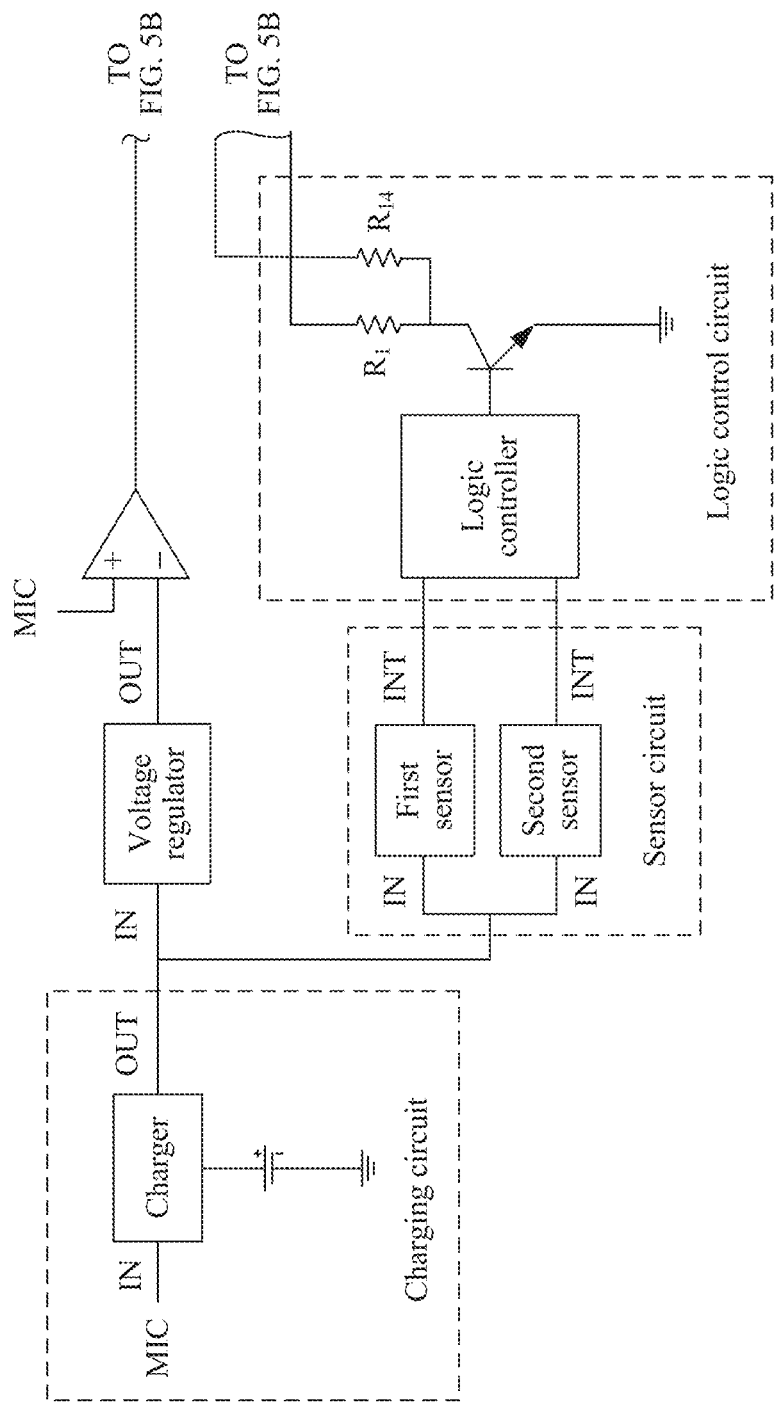
FIG. 5A and FIG. 5B are a circuit diagram of another headset according to an embodiment of this application.
Figure 5B:
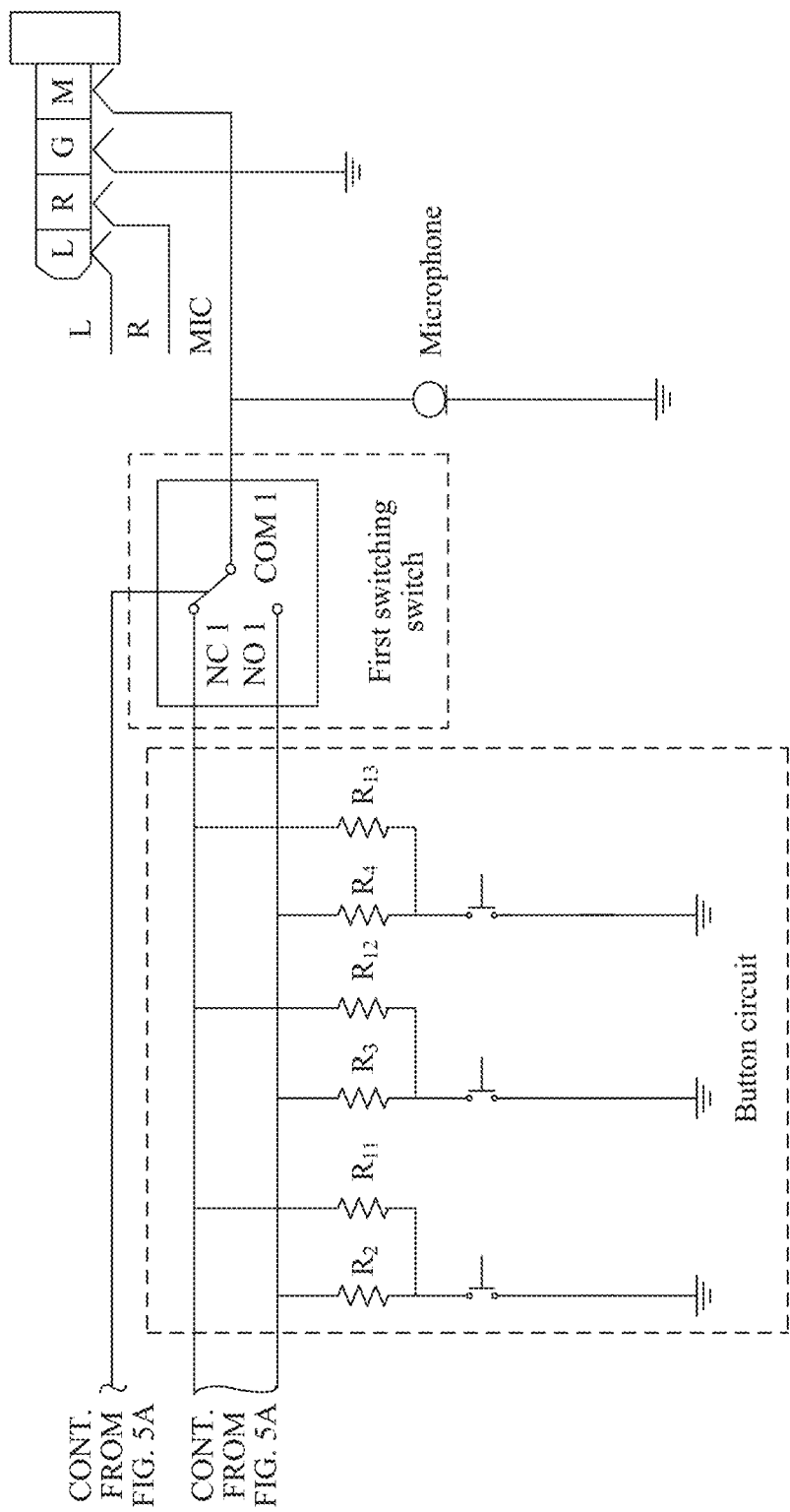

The headset provided in this embodiment of this application is described below and may be connected to the terminal provided in FIG. 3. FIG. 5A and FIG. 5B are a circuit diagram of another headset according to an embodiment of this application. The headset may include a connector of the headset configured to connect to the terminal, and the connector of the headset includes a plurality of functional pins, for example, a left pin (L), a right pin (R), a ground pin (G), and a microphone pin (MIC). The headset may further include a left earbud, a right earbud, and a microphone. The microphone is configured to: collect a sound signal and transmit the sound signal to the terminal by using the MIC pin. In addition, the headset may include a charging circuit and a logic control circuit in addition to the sensor circuit, the button circuit, the voltage regulator (LDO), the comparator, and the first switching switch that are included in the headset described in Embodiment 2.

The charging circuit includes a battery and a charger. One end of the battery is connected to the charger and the other end of the battery is grounded. An input end of the charger is connected to the MIC pin, and an output end of the charger is connected to the first sensor and the second sensor. Different from the charging circuit in Embodiment 1, herein, there is no need to use a dedicated charger to charge the headset, and there is no need to recharge the headset after power of the battery is exhausted. Instead, the power supply circuit in the terminal is used to charge the charging circuit in the headset. The terminal may also supply power to the charging circuit in the headset while providing the power supply circuit for the headset by using the MIC pin.

Based on Embodiment 2, a second resistor $(R_{14})$ is newly added to the logic control circuit, and the second resistor $(R_{14})$ is a kilohm-level resistor. One end of the second resistor $(R_{14})$ is connected to the transistor, and the other end of the second resistor $(R_{14})$ is connected to the second connection end (NC 1) of the first switching switch. When the terminal provides the MIC circuit for the headset by using the MIC pin, the first fixed end (COM 1) of the first switching switch is connected to the second connection end (NC 1). In this case, the charging circuit in the headset supplies power to the sensor circuit. When the transistor is conducted, the second resistor $(R_{14})$ may be used to change a voltage value on the MIC pin. In this case, the second resistor $(R_{14})$ and the voltage sampling resistor $(R_6)$ in the terminal are connected in series, so that the terminal can perform a corresponding operation event by using the voltage value on the MIC pin that is detected by the third analog-to-digital converter (ADC 3).

Because the voltage sampling resistor $(R_6)$ and the second button resistors $(R_{11}, R_{12}, \text{and } R_{13})$ are all kilohm-level resistors, it can be ensured, only when the second resistor $(R_{14})$ is also a kilohm-level resistor, that when the MIC pin is connected to the MIC circuit, the terminal can correctly identify whether a change in the voltage on the MIC pin is generated because the transistor is conducted or because a specific button is conducted.

For example, it is assumed that both the sensors in the left and right earbuds are capacitive sensors, the logic controller is an OR gate, the power supply circuit in the terminal supplies power to the sensor circuit in the headset by using the MIC pin. When the power supply circuit in the terminal cannot work, the charging circuit in the headset supplies power to the sensor circuit in the headset. When a call is detected on the terminal, and a user wears the headset, output of a capacitive sensor in at least one earbud of the headset changes from a low level to a high level, and a high level is output after an OR operation is performed by using the logic controller (the OR gate), so that the transistor is conducted, and the first resistor $R_1$ is used to change a voltage value on the MIC pin from 0 to $V_1$. After the terminal detects that the voltage value on the MIC pin changes, if a target operation event found by the terminal based on a change in the voltage value is automatically answering the call, the terminal automatically answers the call. The fifth fixed end (COM 1) of the third switching switch switches from the tenth connection end (NO 1) to the ninth connection end (NC 1), in other words, the terminal automatically switches from the power supply circuit to the MIC circuit. In this case, the terminal provides the MIC circuit for the headset by using the MIC pin, and the charging circuit in the headset supplies power to the sensor circuit, so that the user can input a voice (a sound signal) by using the microphone, and the sound signal is transmitted to the terminal by using the MIC pin. Meanwhile, the comparison output end of the comparator controls the first fixed end (COM 1) of the first switching switch to switch from the first connection end (NO 1) to the second connection end (NC 1). The second resistor $R_{14}$ and each button each are connected to the MIC pin by using a second button resistor. When the transistor is conducted or a button is pressed, $R_{14}$ or a second button resistor corresponding to the button may be used to change the voltage value on the MIC pin, so that the terminal detects the voltage value on the MIC pin by using the third analog-to-digital converter (ADC 3), and performs a target operation event based on the voltage value on the MIC pin.

When the user takes off the headset, output of the capacitive sensors in the two earbuds of the headset changes from a high level to a low level, and a low level is output after an OR operation is performed by using the logic controller (the OR gate), so that the transistor is cut off, and a voltage value on the MIC pin changes from $V_1$ to 0. After the terminal detects that the voltage value on the MIC pin changes, if a target operation event found by the terminal based on a change in the voltage value is automatically hanging up the call, the terminal automatically hangs up the call. In this case, the terminal is in a non-voice input state, and the fifth fixed end (COM 1) of the third switching switch switches from the ninth connection end (NC 1) to the tenth connection end (NO 1), in other words, the terminal automatically switches from the MIC circuit to the power supply circuit. In this case, the terminal provides the power supply circuit for the headset by using the MIC pin, and charges the charging circuit in the headset by using the MIC pin. Meanwhile, the comparison output end of the comparator controls the first fixed end (COM 1) of the first switching switch to switch from the second connection end (NC 1) to the first connection end (NO 1). The first resistor $R_1$ and each button each are connected to the MIC pin by using a first button resistor. When the transistor is conducted or a button is pressed, $R_1$ or a first button resistor corresponding to the button may be used to change the voltage value on the MIC pin, so that the terminal detects the voltage value on the MIC pin by using the second analog-to-digital converter (ADC 2), and performs a target operation event based on the voltage value on the MIC pin.

This embodiment of this application provides the terminal and the headset, the power supply circuit, the sensor identification circuit, and the third switching switch are newly added to the terminal, and the charging circuit, the sensor circuit, the logic control circuit, the button circuit, the voltage regulator, the comparator, and the first switching switch are newly added to the headset. The terminal supplies power to the sensor in the headset, charges the charging circuit in the headset, and provides the MIC circuit or the power supply circuit for the headset by reusing the MIC circuit. In this application, the microphone and the sensor circuit may work at the same time, and the charging circuit in the headset supplies power to the sensor circuit when the microphone works. The sensor senses a wearing status of the headset, and controls, after output of the sensor passes through the logic control circuit, the transistor to be conducted, to change the voltage value on the MIC pin of the headset, so that the terminal performs a target operation event based on a change in the voltage value on the MIC pin. For example, when the headset is worn, the terminal automatically plays music or a video, and when the headset is taken off, the terminal automatically pauses or stops music or video playing. For another example, when a call is detected, the headset is worn to automatically answer the call, and the headset is taken off to automatically hang up the call. In this embodiment of this application, a manual operation of the user can be replaced, to avoid a case in which a received message is incomplete when the user manually enters the operation, thereby improving user experience, reducing power consumption, and so on.

Embodiment 4

A terminal needs to supply power to a headset provided in an embodiment of this application. In this application, a power supply circuit is provided for the headset by using a first functional pin or a second functional pin. The first functional pin may be a MIC pin, and the second functional pin may be an L pin or an R pin. In this embodiment, an example in which the second functional pin is the R pin is used for description. When the terminal provides a MIC circuit for the headset by using the MIC pin, the terminal may simultaneously provide the power supply circuit for the headset by using the R pin. When the terminal provides an audio circuit for the headset by using the R pin, the terminal may simultaneously provide the power supply circuit for the headset by using the MIC pin. The audio circuit is used by the terminal to provide a sound signal for the headset.

Figure 6:
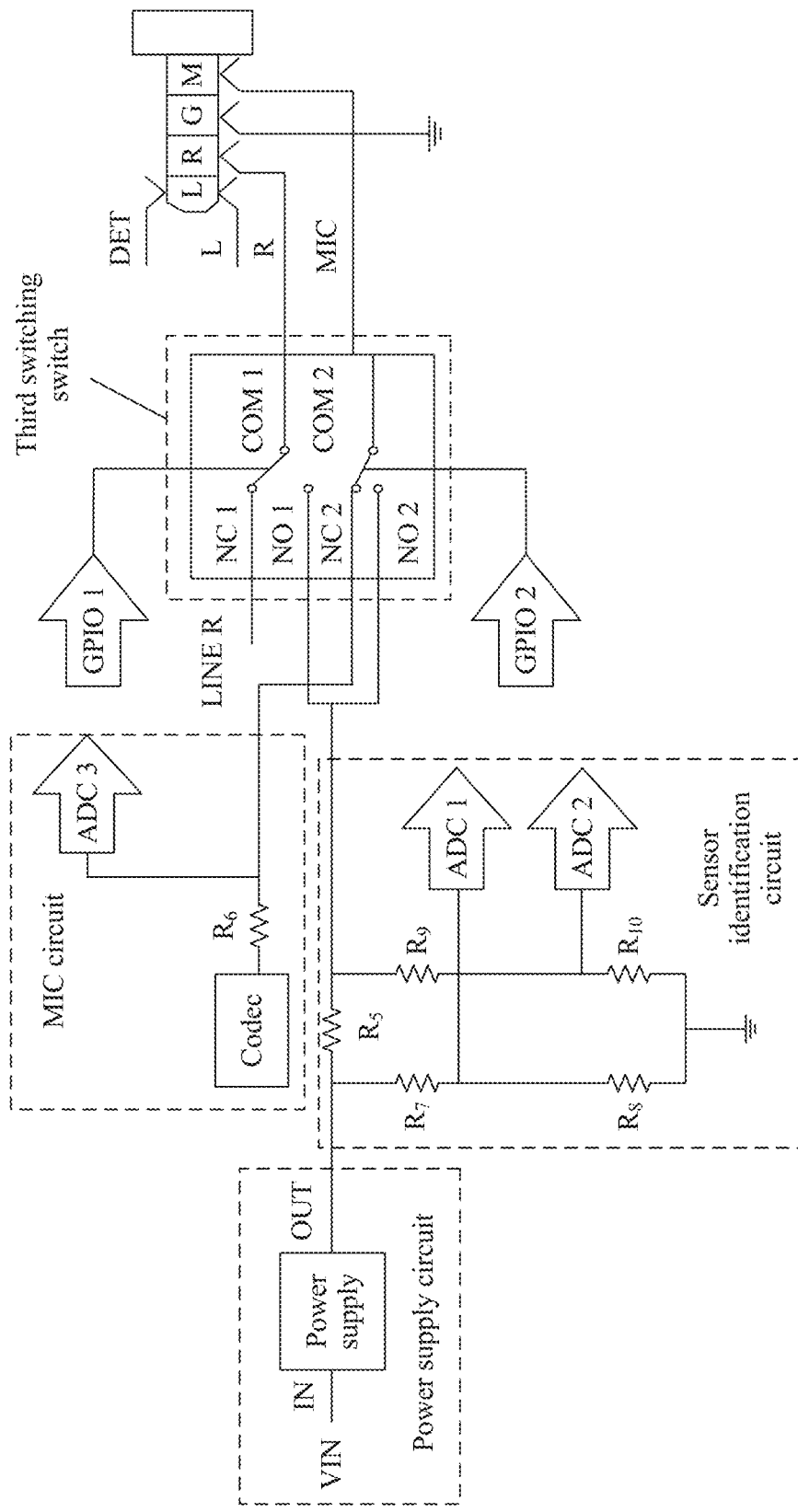
FIG. 6 is a circuit diagram of a terminal according to an embodiment of this application.

FIG. 6 is a circuit diagram of another terminal according to an embodiment of this application. The terminal includes a headset jack that may be connected to a connector of a headset having a sensor. The connector of the headset includes at least one functional pin. When the connector of the headset is plugged into the headset jack of the terminal, the terminal is connected to the headset by using the at least one functional pin of the connector of the headset. The terminal may include a detection pin (DET), and the at least one functional pin of the headset may include a left pin (L), a right pin (R), a ground pin (G), and a microphone pin (MIC). The terminal may determine, by detecting a level of the detection pin (DET), whether the connector of the headset is plugged. When the connector of the headset is plugged into the headset jack of the terminal, the left pin (L) of the headset and the detection pin (DET) of the terminal are short-circuited, and the detected level of the detection pin (DET) is a low level. When no connector of the headset is plugged into the headset jack of the terminal, the detected level of the detection pin (DET) is a high level.

In addition, the terminal further includes a power supply circuit, a sensor identification circuit, a MIC circuit, and a third switching switch.

In this embodiment of this application, the electric circuit, the sensor identification circuit, and the MIC circuit in the terminal are the same as the electric circuit, the sensor identification circuit, and the MIC circuit in the terminal provided in Embodiment 2 and Embodiment 3. Details are not described herein again.

The third switching switch includes a fifth connection end (NC 1), a six connection end (NO 1), a seventh connection end (NC 2), an eighth connection end (NO 2), a third control end, a fourth control end, a third fixed end (COM 1), and a fourth fixed end (COM 2). The fifth connection end (NC 1) is connected to an audio circuit (LINE R), the sixth connection end (NO 1) is connected to the current sampling resistor ($R_5$), the third fixed end (COM 1) is connected to the R pin, the seventh connection end (NC 2) is connected to the voltage sampling resistor ($R_6$), the eighth connection end (NO 2) is connected to the current sampling resistor, and the fourth fixed end (COM 2) is connected to the MIC pin. The third control end is connected to GPIO 1, and the fourth control end is connected to GPIO 2. When it is detected that the terminal is in a voice input state, the GPIO 1 may control, by using the third control end, the third fixed end (COM 1) to connect to the sixth connection end (NO 1), and the GPIO 2 may control, by using the fourth control end, the fourth fixed end (COM 2) to connect to the seventh connection end (NC 2), in other words, the terminal provides the power supply circuit for the headset by using the R pin, and simultaneously provides the MIC circuit for the headset by using the MIC pin. When it is detected that the terminal is in an audio output state, the GPIO 1 may control, by using the third control end, the third fixed end (COM 1) to connect to the fifth connection end (NC 1), and the GPIO 2 may control, by using the fourth control end, the fourth fixed end (COM 2) to connect to the eighth connection end (NO 2), in other words, the terminal provides the audio circuit for the headset by using the R pin, and simultaneously provides the power supply circuit for the headset by using the MIC pin. The voice input state may occur in a scenario in which a microphone needs to be used, for example, in a call, a voice, or a video. The audio output state may occur in a music listening scenario. It can be learned that a state in which both voice input and audio output occur, for example, a state in which a user is in a conversation with the other party during a call is considered as a voice input state. The audio output state is a state in which the terminal outputs only a sound signal.

Figure 7A:
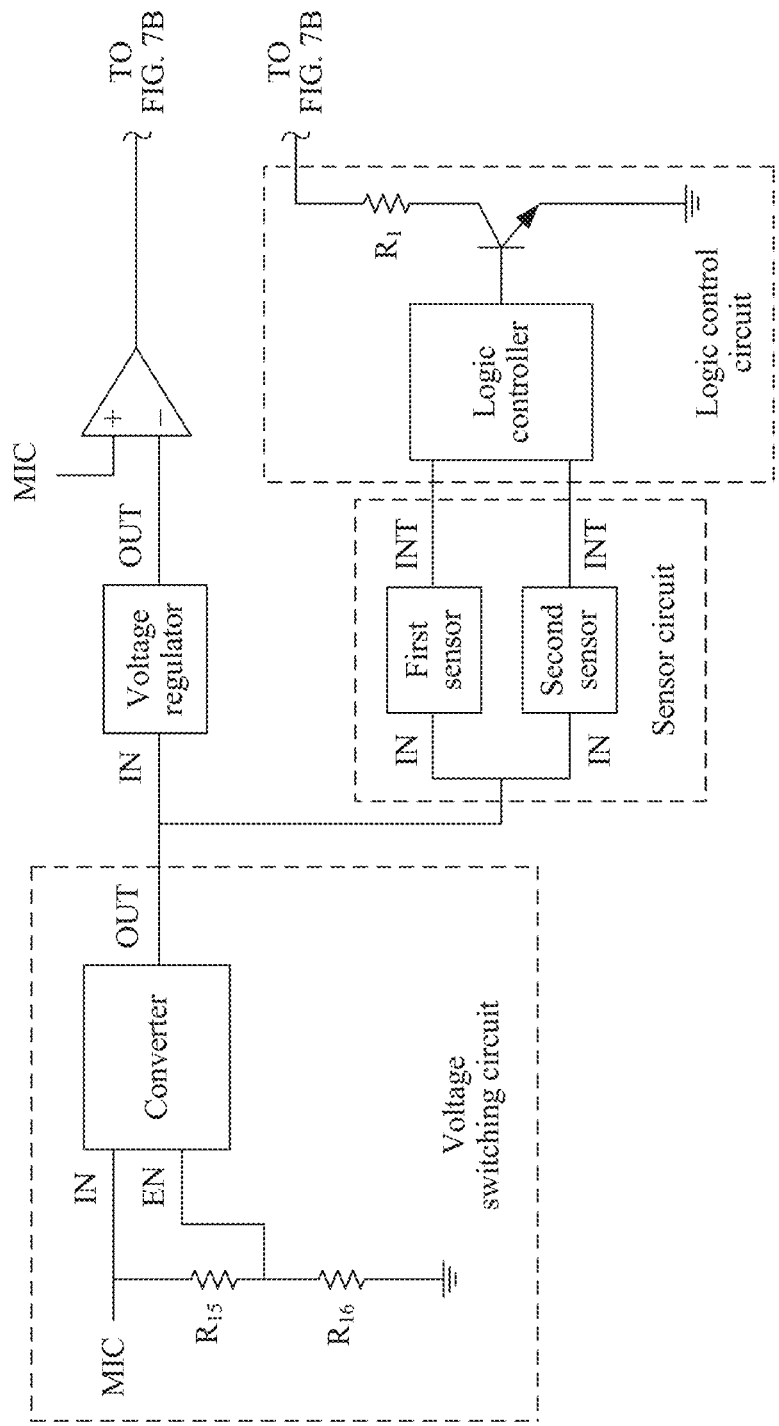
FIG. 7A and FIG. 7B are a circuit diagram of another headset according to an embodiment of this application.
Figure 7B:
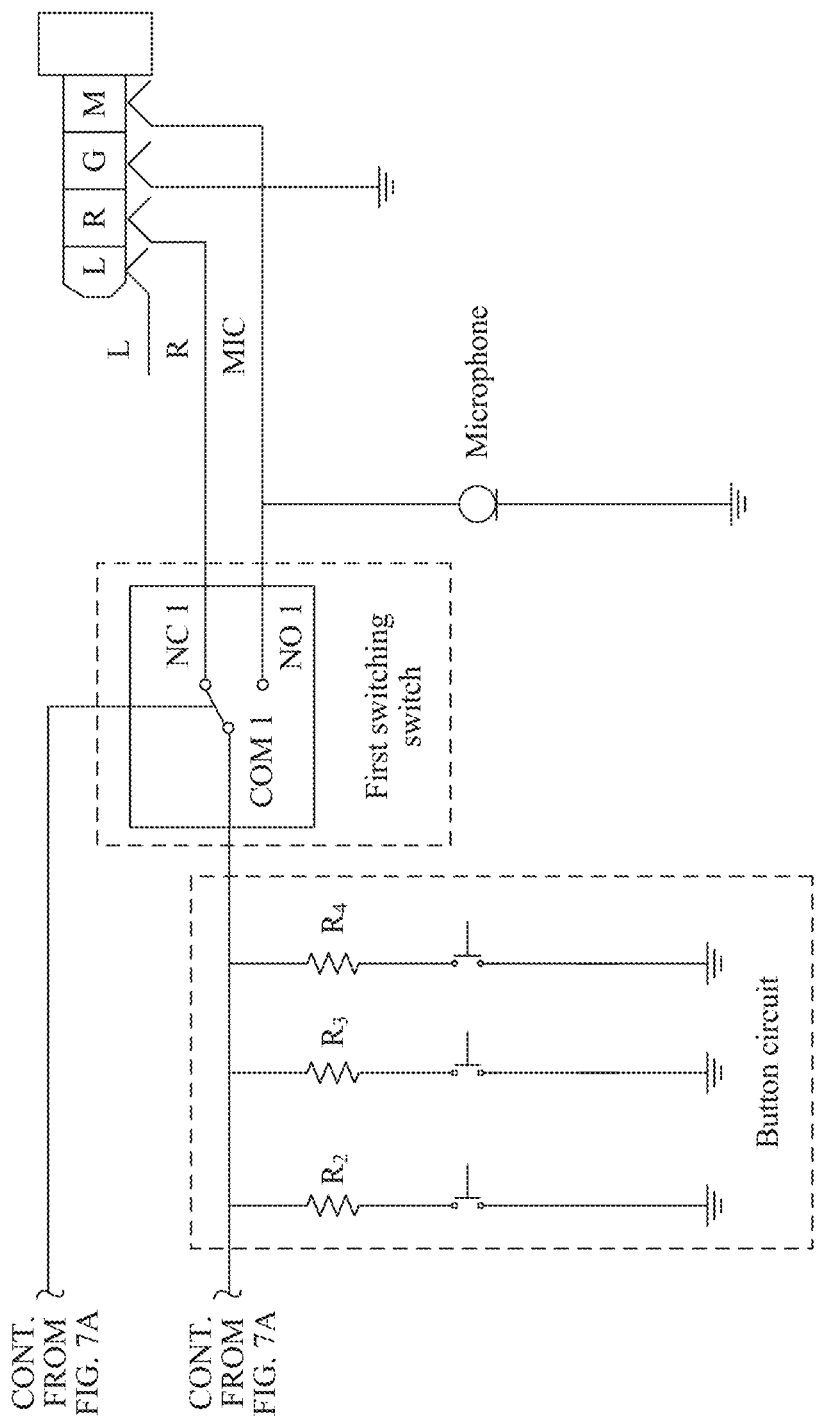

The headset that has the sensor and that is connected to the terminal provided in FIG. 6 is described below. FIG. 7A and FIG. 7B are a circuit diagram of another headset according to an embodiment of this application. The headset may include a connector of the headset configured to connect to the terminal, and the connector of the headset includes a plurality of functional pins, for example, a left pin (L), a right pin (R), a ground pin (G), and a microphone pin (MIC). The headset may further include a left earbud, a right earbud, and a microphone. The microphone is configured to: collect a sound signal and transmit the sound signal to the terminal by using the MIC pin. A left speaker and a right speaker are respectively placed in the left earbud and the right earbud. The left speaker is connected to the L pin, and is configured to output a sound signal that is output by the terminal by using the L pin, and the right speaker is connected to the R pin, and is configured to output a sound signal that is output by the terminal by using the R pin.

The headset may include a first switching switch in addition to the sensor circuit and the logic control circuit that are described in Embodiment 1 and the voltage switching circuit, the voltage regulator (LDO), and the comparator that are described in Embodiment 2. The first resistor ($R_1$) in the logic control circuit is connected to the first switching switch.

The first switching switch includes a first connection end (NO 1), a second connection end (NC 1), a first control end, and a first fixed end (COM 1). The first fixed end (COM 1) is connected to the first resistor ($R_1$) in the logic control circuit and each first button resistor ($R_2$, $R_3$, or $R_4$) in a button circuit. The first connection end (NO 1) is connected to the MIC pin, and the second connection end (NC 1) is connected to the R pin. The first control end is connected to the comparison output end of the comparator, and the first control end is used to control, based on an output result of the comparator, the first switching switch to perform switching. When it is determined, based on a comparison result of the comparator, that the terminal provides the power supply circuit for the headset by using the MIC pin in this case, the first control end is used to control the first fixed end (COM 1) of the first switching switch to connect to the first connection end (NO 1). When it is determined, based on a comparison result of the comparator, that the terminal provides the MIC circuit for the headset by using the MIC pin in this case, the first control end is used to control the first fixed end (COM 1) of the first switching switch to connect to the second connection end (NC 1).

For example, it is assumed that both sensors in the left and right earbuds are capacitive sensors, the logic controller is an OR gate, the power supply circuit in the terminal supplies power to the sensor circuit in the headset by using the MIC pin or the R pin. When a call is detected on the terminal, and a user wears the headset, output of a capacitive sensor in at least one earbud of the headset changes from a low level to a high level, and a high level is output after an OR operation is performed by using the logic controller (the OR gate), so that the transistor is conducted, and the first resistor $R_1$ is used to change a voltage value on the MIC pin from 0 to $V_1$. After the terminal detects that the voltage value on the MIC pin changes, if a target operation event found by the terminal based on a change in the voltage value is automatically answering the call, the terminal automatically answers the call. The third fixed end (COM 1) of the third switching switch is connected to the sixth connection end (NO 1), the fourth fixed end (COM 2) of the third switching switch is connected to the seventh connection end (NC 2), and the power supply circuit is provided for the headset by using the R pin. Meanwhile, the comparison output end of the comparator controls the first fixed end (COM 1) of the first switching switch to connect to the second connection end (NC 1). When the transistor is conducted, the first resistor $R_1$ is used to change a voltage value on the R pin, so that the terminal detects the voltage value on the R pin by using the second analog-to-digital converter (ADC 2), and performs a target operation event based on the voltage value on the R pin. When the user takes off the headset, both output of the capacitive sensors in the two earbuds of the headset changes from a high level to a low level, and a low level is output after an operation is performed by using the logic controller (the OR gate), so that the transistor is cut off, and a voltage value on the MIC pin changes from $V_1$ to 0. After the terminal detects that the voltage value on the MIC pin changes, if a target operation event found by the terminal based on a change in the voltage value is automatically hanging up the call, the terminal automatically hangs up the call.

When it is detected that the terminal plays music, the third fixed end (COM 1) of the third switching switch is connected to the fifth connection end (NC 1), the fourth fixed end (COM 2) of the third switching switch is connected to the eighth connection end (NO 2), and the power supply circuit is provided for the headset by using the MIC pin. Meanwhile, the comparison output end of the comparator controls the first fixed end (COM 1) of the first switching switch to connect to the first connection end (NO 1). When the transistor is conducted, the first resistor $R_1$ is used to change a voltage value on the MIC pin, so that the terminal detects the voltage value on the MIC pin by using the second analog-to-digital converter (ADC 2), and performs a target operation event based on the voltage value on the MIC pin.

This embodiment of this application provides the terminal and the headset, the power supply circuit, the sensor identification circuit, and the third switching switch are newly added to the terminal, and the voltage switching circuit, the sensor circuit, the logic control circuit, the voltage regulator, the comparator, and the first switching switch are newly added to the headset. The terminal supplies power to the sensor in the headset, and provides the power supply circuit for the sensor circuit in the headset by using the MIC pin or the R pin. In this application, when it is detected that the terminal is in the voice input state, the terminal supplies power to the sensor circuit by using the R pin, and simultaneously outputs a sound signal by using the L pin, to be specific, the left speaker connected to the L pin outputs the sound signal, and the right speaker connected to the R pin does not output the sound signal. The sensor senses a wearing status of the headset, and controls, after output of the sensor passes through the logic control circuit, the transistor to be conducted, to change the voltage value on the R pin of the headset, so that the terminal performs a target operation event based on a change in the voltage value on the R pin. When it is detected that the terminal is in the audio output state, the terminal supplies power to the sensor circuit by using the MIC pin. The sensor senses a wearing status of the headset, and controls, after output of the sensor passes through the logic control circuit, the transistor to be conducted, to change the voltage value on the MIC pin of the headset, so that the terminal performs a target operation event based on a change in the voltage value on the MIC pin. For example, when the headset is worn, the terminal automatically plays music or a video, and when the headset is taken off, the terminal automatically pauses or stops music or video playing. For another example, when a call is detected, the headset is worn to automatically answer the call, and the headset is taken off to automatically hang up the call. In this embodiment of this application, a manual operation of the user can be replaced, to avoid a case in which a received message is incomplete when the user manually enters the operation, thereby improving user experience, reducing power consumption, and so on.

It can be learned that when the second functional pin is the L pin, the second connection end (NC 1) is connected to the L pin. When it is detected that the terminal is in the voice input state, the terminal supplies power to the sensor circuit by using the L pin, and simultaneously outputs a sound signal by using the R pin, to be specific, the right speaker connected to the R pin outputs the sound signal, and the left speaker connected to the L pin does not output the sound signal, so that the terminal performs a target operation event by detecting a change in a voltage value on the L pin of the headset. When it is detected that the terminal is in the audio output state, the terminal supplies power to the sensor circuit by using the MIC pin, so that the terminal performs a target operation event by detecting a change in the voltage value on the MIC pin of the headset.

Embodiment 5

A terminal provided in an embodiment of this application is totally the same as the terminal provided in Embodiment 4. Details are not described herein again.

A sound signal copy circuit is newly added, based on the headset provided in Embodiment 4, in a headset provided in this embodiment of this application. The connector of the headset further includes a third functional pin. When the second functional pin is the R pin, the third functional pin is the L pin. When the second functional pin is the L pin, the third functional pin is the R pin. An example in which the second pin is the R pin and the third pin is the L pin is used herein for description. It is assumed that there is a sound transmission channel between the R pin and the right speaker, which is referred to as a first sound transmission channel, and there is a sound transmission channel between the L pin and the left speaker, which is referred to as a second sound transmission channel.

Figure 8:
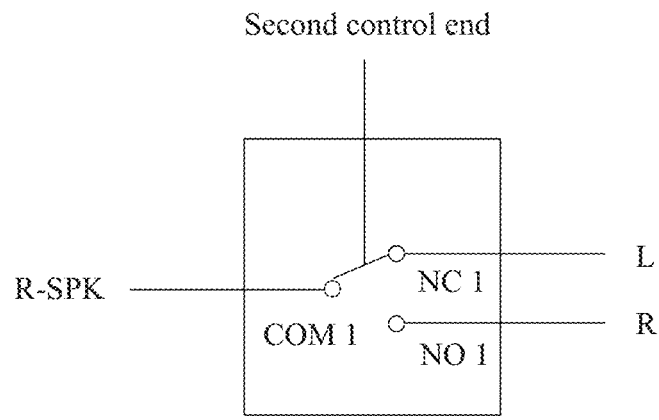
FIG. 8 is a diagram of a sound signal copy circuit according to an embodiment of this application.

FIG. 8 is a diagram of a sound signal copy circuit according to an embodiment of this application. The sound signal copy circuit includes a second switching switch. The second switching switch includes a third connection end (NO 1), a fourth connection end (NC 1), a second control end, and a second fixed end (COM 1). The second fixed end (COM 1) is connected to the first sound transmission channel (R-SPK), the third connection end (NO 1) is connected to the R pin, the fourth connection end (NC 1) is connected to the L pin, and the second control end is connected to the comparison output end of the comparator. When an output result of the comparison output end indicates that the MIC pin is connected to the power supply circuit, the comparison output end controls the second fixed end (COM 1) of the second switching switch to connect to the third connection end (NO 1). When an output result of the comparison output end indicates that the MIC pin is connected to the MIC circuit, the comparison output end controls the second fixed end (COM 1) of the second switching switch to connect to the fourth connection end (NC 1).

In this embodiment of this application, when it is detected that the terminal is in a voice input state, the terminal may supply power to the sensor circuit by using the R pin, simultaneously output a sound signal by using the L pin, and copy, into the first sound transmission channel connected to the R pin, the sound signal that is output by the L pin. In other words, the sound signal transmitted on the first sound transmission channel is the same as a sound signal transmitted on the second sound transmission channel. To be specific, the left speaker and the right speaker simultaneously output the sound signal transmitted on the second sound transmission channel, to improve user experience.

It can be learned that when the second pin is the L pin and the third pin is the R pin, the second fixed end (COM 1) is connected to the second sound transmission channel (L-SPK), the third connection end (NO 1) is connected to the L pin, and the fourth connection end (NC 1) is connected to the R pin. When it is detected that the terminal is in a call mode, the terminal supplies power to the sensor circuit by using the L pin, simultaneously outputs a sound signal by using the R pin, and copies, into the second sound transmission channel connected to the L pin, the sound signal that is output by the R pin. In other words, a sound signal transmitted on the first sound transmission channel is the same as the sound signal transmitted on the second sound transmission channel. To be specific, the left speaker and the right speaker simultaneously output the sound signal transmitted on the first sound transmission channel.

Figure 9:
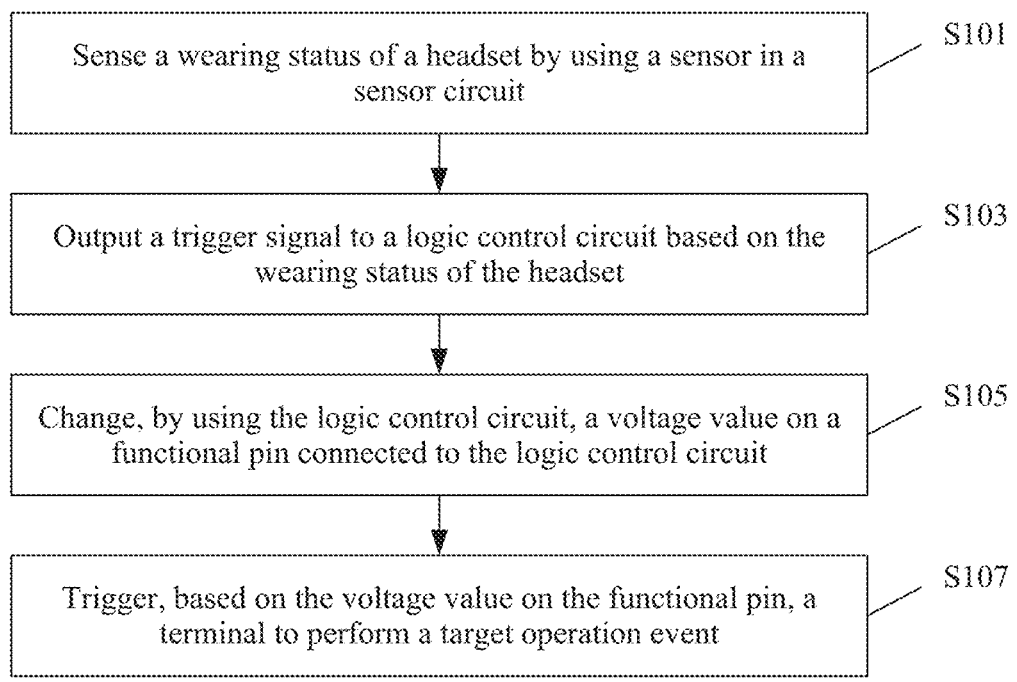
FIG. 9 is a schematic diagram of a control method according to an embodiment of this application.

FIG. 9 is a schematic diagram of a control method according to an embodiment of this application. The control method may include at least the following several steps.

S101. Sense a wearing status of a headset by using a sensor in a sensor circuit.

Specifically, the sensor may be but is not limited to a temperature sensor, a photosensor, a capacitive sensor, an acceleration sensor, or the like. For details about sensing principles of various sensors, refer to the description in Embodiment 1. The details are not described herein again.

S103. Output a trigger signal to a logic control circuit based on the wearing status of the headset.

Specifically, the logic control circuit is a circuit included in the headset. For details about the logic control circuit, refer to the description of the logic control circuit in the foregoing embodiment. The details are not described herein again.

S105. Change, by using the logic control circuit, a voltage value on a functional pin connected to the logic control circuit.

Specifically, the functional pin is a functional pin of a connector of the headset, the connector of the headset includes at least one functional pin, and the connector of the headset is a connector used by the headset to connect to a terminal.

Specifically, for details about a process in which the logic control circuit changes the voltage value on the functional pin, refer to the foregoing embodiment. The details are not described herein again.

S107. Trigger, based on the voltage value on the functional pin, a terminal to perform a target operation event.

Specifically, the target operation event is preset for the voltage value on the functional pin. For details about a process of triggering the terminal to perform the target operation event based on the voltage value on the functional pin, refer to the foregoing embodiment. The details are not described herein again.

In this embodiment of this application, the voltage on the functional pin can be changed after output of the sensor circuit passes through the logic control circuit, so that the terminal performs different operation events based on different voltage values on the functional pin.

Persons of ordinary skill in the art may understand that all or some of the processes of the method in the embodiments may be implemented by a computer program instructing related hardware. The program may be stored in a computer readable storage medium. When the program runs, the processes of the method in the embodiments are performed. The storage medium may be a magnetic disk an optical disc, a read-only memory (Read-Only Memory, ROM), or a random access memory (Random Access Memory, RAM).

A sequence of the steps of the method in the embodiments of this application may be adjusted, combined, or removed based on an actual requirement.

The modules in the apparatus in the embodiments of this application may be combined, divided, and deleted based on an actual requirement.

In conclusion, the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A headset, comprising:
a connector configured to couple to a terminal, wherein the connector comprises a first functional pin and a second functional pin;
configured to:
sense a wearing status of the headset; and
output a trigger signal to a logic control circuit when the wearing status changes, wherein the logic control circuit is configured to:
couple at least one functional pin to the sensor circuit;
receive the trigger signal from the sensor circuit; and
change, based on the trigger signal, a first voltage value on the at least one functional pin to a second voltage value to trigger the terminal to perform a target operation event based on the second voltage value, wherein the target operation event is preset for the second voltage value;
a voltage regulator comprising a voltage regulation input end and a voltage regulation output end;
a first switching switch comprising:
a first control end;
a first fixed end;
a first connection end; and
a second connection end; and
a comparator comprising:
a first voltage input end coupled to the first functional pin and configured to input a third voltage value from the first functional pin;
a second voltage input end coupled to the voltage regulation output end and configured to input a reference voltage value from the voltage regulation output end; and
coupled to the first control end and configured to:
output a comparison result;
determine, based on the comparison result, whether the first functional pin is coupled to a power supply circuit or a microphone (MIC) circuit of the terminal;
control the first fixed end to couple to the first connection end when the first functional pin is coupled to the power supply circuit; and
control the first fixed end to couple to the second connection end when the first functional pin is coupled to the MIC circuit.

2. The headset of claim 1, wherein the first fixed end is further coupled to the logic control circuit, wherein the first connection end is further coupled to the first functional pin, and wherein the second connection end is further coupled to the second functional pin.

3. The headset of claim 2, further comprising a button circuit, wherein the button circuit comprises a plurality of buttons and a plurality of first button resistors that are in a one-to-one correspondence with the buttons, and wherein each of the buttons is coupled to the first fixed end using a first button resistor corresponding to the button.

4. The headset of claim 3, wherein the sensor circuit comprises a first sensor and a second sensor, and wherein the logic control circuit comprises:
   a transistor;
   a first resistor; and
   a logic controller comprising a first input end coupled to the first sensor;
      a second input end coupled to the second sensor; and
      a logic output end, wherein the logic output end is coupled to a first end of the first resistor using the transistor, and wherein a second end of the first resistor is coupled to the first fixed end.

5. The headset of claim 4, wherein the connector further comprises a third functional pin, and wherein the headset further comprises:
   a first sound transmission channel;
   a second sound transmission channel; and
   a second switching switch comprising:
      a third connection end coupled to the second functional pin;
      a fourth connection end coupled to the third functional pin;
      a second control end coupled to the comparison output end; and
      a second fixed end coupled to the first sound transmission channel, and
      wherein the comparison output end is further configured to:
         control the second fixed end to couple to the third connection end when an output result of the comparison output end indicates that the first functional pin is coupled to the power supply circuit; and
         control the second fixed end to couple to the fourth connection end when the output result indicates that the first functional pin is coupled to the MIC circuit.

6. The headset of claim 4, further comprising a voltage switching circuit that comprises:
   a second switch comprising:
      an input end coupled to the at least one functional pin;
      an enable end; and
      a switching output end coupled to the first sensor, the second sensor, and the voltage regulation input end;
   a first voltage divider resistor, wherein a first end of the first voltage divider resistor is coupled to the at least one functional pin, and wherein a second end of the first voltage divider resistor is configured to couple to the enable end; and
   a second voltage divider resistor coupled to the first voltage divider resistor in series.

7. The headset of claim 1, further comprising a button circuit, and wherein the button circuit comprises:
   a plurality of buttons;
   a plurality of first button resistors; and
   a plurality of second button resistors,
   wherein the first button resistors and the second button resistors are in a one-to-one correspondence with the buttons,
   wherein each of the buttons is coupled to the first connection end using a first button resistor corresponding to the button,
   wherein each of the buttons is further coupled to the second connection end using a second button resistor corresponding to the button, and
   wherein the first fixed end is coupled to the first functional pin.

8. The headset of claim 7, wherein the sensor circuit comprises a first sensor and a second sensor, and wherein the logic control circuit comprises:
   a transistor;
   a first resistor; and
   a logic controller comprising:
      a first input end coupled to the first sensor;
      a second input end coupled to the second sensor; and
      a logic output end coupled to a first end of the first resistor using the transistor,
   wherein a second end of the first resistor is coupled to the first connection end.

9. The headset of claim 8, further comprising a voltage switching circuit that comprises:
   a second switch comprising:
      an input end coupled to the first functional pin;
      an enable end; and
      a switching output end coupled to the first sensor, the second sensor, and the voltage regulation input end;
   a first voltage divider resistor, wherein a first end of the first voltage divider resistor is coupled to the first functional pin, and wherein a second end of the first voltage divider resistor is coupled to the enable end; and
   a second voltage divider resistor coupled to the first voltage divider resistor series.

10. The headset of claim 8, wherein the logic control circuit further comprises a second resistor, wherein the logic output end is further coupled to a first end of the second resistor using the transistor, and wherein a second end of the second resistor is coupled to the second connection end.

11. The headset of claim 10, further comprising a charging circuit, wherein the charging circuit comprises a battery and a charger, wherein a first end of the battery is coupled to the charger, wherein an input end of the charger is coupled to the first functional pin, and wherein an output end of the charger is coupled to the first sensor, the second sensor, and the voltage regulation input end.

12. A terminal configured to be coupled to a headset having a sensor circuit and a connector comprising a first functional pin and a second functional pin, the terminal comprising:
   a headset jack configured to connect to the connector, wherein the terminal is configured to be coupled to the headset using the first functional pin and the second functional pin when the connector is plugged into the headset jack;
   a microphone (MIC) circuit;
   a power supply circuit coupled to the headset jack and configured to supply power to the sensor circuit;
   a sensor identification circuit coupled to the headset jack and configured to determine whether a sensor signal is transmitted to the headset; and
   a switching switch coupled to the headset jack and configured to control the terminal to provide the MIC circuit or the power supply circuit for the headset.

13. The terminal of claim 12, wherein the power supply circuit is further coupled to the sensor identification circuit, and wherein the sensor identification circuit comprises:
   a current sampling resistor, wherein a first end of the current sampling resistor is coupled to the power supply circuit, and wherein a second end of the current sampling resistor is coupled to the switching switch;
a first analog-to-digital converter configured to:
collect a first voltage at the first end of the current sampling resistor; and
calculate a current flowing through the current sampling resistor; and
a second analog-to-digital converter configured to:
collect a second voltage at the second end of the current sampling resistor; and
calculate the current flowing through the current sampling resistor, and
wherein the MIC circuit comprises:
a codec;
a voltage sampling resistor, wherein a first end of the voltage sampling resistor is coupled to the switching switch, and wherein a second end of the voltage sampling resistor is coupled to the codec; and
a third analog-to-digital converter configured to collect a voltage at the first end of the voltage sampling resistor.

14. The terminal of claim 13, further comprising an audio circuit, and wherein the switching switch comprises:
a first connection end coupled to the audio circuit;
a second connection end coupled to the current sampling resistor;
a third connection end coupled to the voltage sampling resistor;
a fourth connection end coupled to the current sampling resistor;
a first fixed end configured to couple to the second functional pin;
a second fixed end configured to couple to the first functional pin;
a first control end configured to control the first fixed end to couple to the first connection end; and
a second control end configured to control the second fixed end to couple to the third connection end.

15. The terminal of claim 13, wherein the switching switch further comprises:
a fifth connection end coupled to the voltage sampling resistor;
a sixth connection end coupled to the current sampling resistor;
a third fixed end configured to couple to the first functional pin; and
a third control end configured to control the third fixed end to couple to the fifth connection end.

16. The terminal of claim 13, further comprising an audio circuit, and wherein the switching switch comprises:
a first connection end coupled to the audio circuit;
a second connection end coupled to the current sampling resistor;
a third connection end coupled to the voltage sampling resistor;
a fourth connection end coupled to the current sampling resistor;
a first fixed end configured to couple to the second functional pin;
a second fixed end configured to couple to the first functional pin;
a first control end configured to control the first fixed end to couple to the first connection end; and
a second control end configured to control the second fixed end to couple to the fourth connection end.

17. The terminal of claim 13, further comprising an audio circuit, and wherein the switching switch comprises:
a first connection end coupled to the audio circuit;
a second connection end coupled to the current sampling resistor;
a third connection end coupled to the voltage sampling resistor;
a fourth connection end coupled to the current sampling resistor;
a first fixed end configured to couple to the second functional pin;
a second fixed end configured to couple to the first functional pin;
a first control end configured to control the first fixed end to couple to the second connection end; and
a second control end configured to control the second fixed end to couple to the third connection end.

18. The terminal of claim 13, further comprising an audio circuit, and wherein the switching switch comprises:
a first connection end coupled to the audio circuit;
a second connection end coupled to the current sampling resistor;
a third connection end coupled to the voltage sampling resistor;
a fourth connection end coupled to the current sampling resistor;
a first fixed end configured to couple to the second functional pin;
a second fixed end configured to couple to the first functional pin;
a first control end configured to control the first fixed end to couple to the second connection end; and
a second control end configured to control the second fixed end to couple to the fourth connection end.

19. The terminal of claim 13, wherein the switching switch further comprises:
a fifth connection end coupled to the voltage sampling resistor;
a sixth connection end coupled to the current sampling resistor;
a third fixed end configured to couple to the first functional pin; and
a third control end configured to control the third fixed end to couple to the sixth connection end.

20. A control method implemented by a headset comprising a logic control circuit and a connector including a functional pin coupled to the logic control circuit, the method comprising:
sensing a wearing status of the headset using a sensor in a sensor circuit of the headset;
outputting a trigger signal to a logic control circuit of the headset based on the wearing status;
changing, using the logic control circuit, a first voltage value on the functional pin to a second voltage value, wherein the connector is configured to couple the headset to a terminal; and
triggering, based on the second voltage value, the terminal to perform a target operation event, wherein the target operation event is preset for the second voltage value.

* * * * *